(12) United States Patent
Watson

(10) Patent No.: US 6,794,660 B2
(45) Date of Patent: Sep. 21, 2004

(54) LONG STROKE MOVER FOR A STAGE ASSEMBLY

(75) Inventor: Douglas C. Watson, Campbell, CA (US)

(73) Assignee: Nikon Corporation (JP)

( * ) Notice: Subject to any disclaimer, the term of this patent is extended or adjusted under 35 U.S.C. 154(b) by 213 days.

(21) Appl. No.: 09/929,247

(22) Filed: Aug. 13, 2001

(65) Prior Publication Data

US 2002/0050571 A1 May 2, 2002

Related U.S. Application Data

(63) Continuation-in-part of application No. 09/703,457, filed on Oct. 31, 2000.

(51) Int. Cl.[7] ................................................ H01J 37/20
(52) U.S. Cl. .............................. 250/492.2; 250/442.11; 250/453.11; 378/34; 378/35; 378/208
(58) Field of Search ........................ 250/442.11, 492.1, 250/492.2; 310/10, 12, 208; 378/34, 35

(56) References Cited

U.S. PATENT DOCUMENTS

| | | | | |
|---|---|---|---|---|
| 4,555,650 A | | 11/1985 | Asakawa | |
| 4,757,208 A | * | 7/1988 | McKenna et al. | 250/492.2 |
| 5,130,554 A | * | 7/1992 | Nose et al. | 250/548 |
| 5,483,064 A | * | 1/1996 | Frey et al. | 250/442.11 |
| 5,654,546 A | * | 8/1997 | Lindsay | 250/306 |
| 6,072,183 A | * | 6/2000 | Itoh et al. | 250/492.2 |
| 6,271,606 B1 | * | 8/2001 | Hazelton | 310/12 |
| 6,408,767 B1 | * | 6/2002 | Binnard et al. | 108/20 |

* cited by examiner

*Primary Examiner*—John R. Lee
*Assistant Examiner*—Paul M Gurzo
(74) *Attorney, Agent, or Firm*—Steven G. Roeder; Jim Rose

(57) ABSTRACT

A stage assembly (10) for moving and positioning a device (26) includes a guide base (12), a stage (14), a stage bearing assembly (18), a control system (22), and a Y mover (68). The stage (14) retains the device (26). The stage bearing assembly (18) supports the stage (14) spaced apart from the guide base (12). More specifically, the stage bearing assembly (18) generates an electrostatic force that urges the stage (14) towards the guide base (12). The housing mover (68) moves the stage (14) relative to the guide base (12). The Y mover (68) includes a plurality of magnets and a conductor. The magnets have a magnet length (86) and the conductors have a conductor length (88). Preferably, the magnet length (86) is at least as long as the conductor length (88) plus an X stroke (87) of the stage assembly (10). This design allows the Y mover (68) to provide a force along the Y axis over the range of the positions of the Y mover (68).

45 Claims, 12 Drawing Sheets

LONG STROKE MOVER FOR A STAGE ASSEMBLY

This application is a continuation-in-part of application Ser. No. 09/703,457, filed Oct. 31, 2000, which is currently pending. The contents of application Ser. No. 09/703,457 are incorporated herein by reference.

FIELD OF THE INVENTION

The present invention is directed to a stage assembly for moving a device. More specifically, the present invention is directed to a long stroke mover for moving a stage of the stage assembly.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage that retains the wafer, a wafer vacuum preload type air bearing that supports the wafer stage, and a wafer mover assembly that precisely positions the wafer stage and the wafer. Somewhat similarly, the reticle stage assembly includes a reticle stage base, a reticle stage that retains the reticle, a reticle vacuum preload type air bearing that supports the reticle stage and a reticle mover assembly that precisely positions the reticle stage and the reticle. Typically, the wafer vacuum preload type air bearing is created by releasing air from outlets in a bottom of the wafer stage towards the wafer stage base and pulling a vacuum in inlets in the bottom of the wafer stage. Similarly, the reticle vacuum preload type air bearing is created by releasing air from outlets in a bottom of the reticle stage towards the reticle stage base and pulling a vacuum in inlets in the bottom of the reticle stage.

The size of the images and features within the images transferred onto the wafer from the reticle are extremely small. Accordingly, the precise positioning of the wafer and the reticle relative to the lens assembly is critical to the manufacture of high density, semiconductor wafers.

Depending upon the type of energy beam generated by the illumination source, the type of fluid surrounding the reticle and the wafer can influence the performance of the exposure apparatus. For example, some types of beams, e.g. electron beams and very short wavelengths of ultraviolet light, are absorbed by oxygen and other gases. As is well known, air is a gaseous mixture that is approximately twenty-one percent oxygen. Thus, air surrounding the reticle and wafer can influence the performance of the exposure apparatus and the quality of the integrated circuits formed on the wafer can be compromised. As a result thereof, the performance of the exposure apparatus and the quality of the integrated circuits formed on the wafer can be enhanced by controlling the environment around one or both stages.

One way to control the environment around a stage is to position a chamber around the stage. Subsequently, the desired environment can be created within the chamber around the stage. For example, the chamber may be filled with an inert fluid. Alternately, some processes require that the controlled environment is a vacuum.

Historically, stage assemblies used in a vacuum environment have utilized mechanical type bearings to support the stage. Typical mechanical type bearings include ball bearings, roller bearings or sliding contact. However, limitations on the use of lubricants in a vacuum, rolling or sliding noise or vibration, particle generation, and friction also limit the accuracy and velocity of such stages.

Another solution is to use an air bearing in the vacuum to support the stage. However, air bearings typically require substantial preload forces to have high stiffness, which is desirable for precision stages. Unfortunately, it is not possible to create a vacuum preload type air bearing if the stage is surrounded by a vacuum.

Alternately, a lower air bearings and an opposed upper air bearing can be used to support the stage in the vacuum environment. In this embodiment, the upper air bearing preloads the lower air bearing to create a relatively stiff bearing. However, this design requires an increase in stage mass and/or complexity and an increase in the number of air bearings required by the stage assembly. In addition, the opposed air bearings can deform the stage. Further, the air released to create the air bearing that supports the stage is also released into the chamber. This can compromise the vacuum that is created within the chamber. Thus, the use of air bearings to support the stage can make it difficult to control the environment around the stage.

Additionally, depending upon the type of energy beam generated by the illumination source, the motors used to move the stages can influence the performance of the exposure apparatus. For example, a typical brushless electric motor includes one or more magnets and one or more coils. Unfortunately, the magnetic fields from the motor can influence a number of manufacturing, measurement and/or inspection processes. More specifically, for example, electron beams are influenced by magnetic fields of sufficient magnitude. As a result thereof, the electric motors must be positioned a relatively large distance away from the electron beam. Similar design considerations apply to other charged particle lithography systems, including ion beam systems, as well as charged particle inspection or metrology systems.

In light of the above, there is a need for a bearing assembly and method for supporting a stage that does not compromise the desired environment around the stage. Additionally, there is a need for a relatively stiff bearing assembly for supporting a stage in a vacuum. Moreover, there is a need for a bearing assembly for an exposure apparatus that utilizes an electron beam. Further, there is a need for a mover that can be positioned relatively close to a stage while reducing the influence of the motor on the energy beam. Also, there is a need for an exposure apparatus capable of manufacturing precision objects, such as high density, semiconductor wafers.

SUMMARY

The present invention is directed to a stage assembly that moves a device. The stage assembly includes a guide base, a stage that retains the device, and a stage bearing assembly that supports the stage spaced apart from the guide base. Uniquely, the stage bearing assembly generates an electrostatic force that urges the stage towards the guide base. Typically, an opposing force is required to balance the electrostatic force. The opposing force can be provided by a number of alternate ways. Further, the electrostatic force can be modulated based on position feedback to provide stiffness and damping relative to a reference. As a result of this design, the stage bearing assembly can be relatively stiff without gas leakage or mechanical contact. Thus, the stage bearing assembly is particularly useful in manufacturing, measurement and/or inspection processes that are operated in a controlled environment such as a vacuum.

As provided herein, the stage bearing assembly includes a base conductive section and a stage conductive assembly that cooperate to generate the electrostatic force that urges the stage towards the guide base. Further, the stage conductive assembly includes a first stage conductive section, a second conductive section and a third conductive section. Moreover, each of the stage conductive sections is electrically isolated from the other stage conductive sections.

The stage assembly also includes a control system that controls the voltage to each of the conductive sections. As provided herein, the control system controls the voltage to the stage conductive sections to actively adjust the force generated by the stage bearing assembly. Preferably, the control system individually controls the voltage to each of the stage conductive sections to adjust the position of the stage relative to the guide base along a Z axis, about an X axis and about a Y axis.

As an overview, the electrostatic attractive pressure between two conductive surfaces is proportional to the voltage difference squared divided by the gap squared. The electrostatic repulsive forces caused by common voltage are very low and are therefore not used by the control system to control the stage bearing assembly. Because only attractive electrostatic forces are generated, an opposing force is needed to balance the electrostatic forces. Techniques for providing the opposing force will be presented in the embodiments below.

Preferably, the stage assembly includes a gap measuring device for measuring a gap between the base conductive section and each of the stage conductive sections and providing feedback of the position of the stage relative to the guide base. The gap measuring device can be used to calculate the voltage required to yield the desired electrostatic force. More specifically, the non-linear and unstable nature of the electrostatic force can be linearized in the control system using the gap measurement in the following equations:

$$V = (h\ \text{gap} + h\ \text{dielectric}/k\ \text{dielectric})\sqrt{(2F/\epsilon_0 A)}$$

where: h gap=mechanical clearance and h dielectric= dielectric thickness, k dielectric=dielectric constant, F=desired force, $\epsilon_0$=permittivity constant=$8.854 \times 10^{-12}$ Farad/m, A=area.

Thus, the voltage required to generate the desired force is calculated using the gap between the base conductive section and each of the stage conductive sections. In one embodiment, the gap measuring device includes a capacitance sensor that measures the capacitance between the base conductive section and each of the stage conductive sections. Using the position feedback, the electrostatic force generated by the stage bearing assembly can be controlled and stiffness of the stage bearing assembly can be created relative to the base.

A couple of embodiments of the stage assembly are provided herein. In a first embodiment, the guide base is positioned above the stage and the electrostatic force generated by the stage bearing assembly urges the stage upward towards the guide base. In the first embodiment, gravity on the stage provides a constant downward force that opposes the attractive electrostatic force. Therefore, the net vertical force at each electrostatic conductive area on the stage can be made positive or negative by controlling the electrostatic attractive force to be greater than or less than the force of gravity.

Preferably, in this embodiment, the stage assembly further includes a safety stop positioned below the stage, so that the stage is prevented from falling a large distance if the voltage is removed from the stage bearing assembly. As provided herein, the safety stop includes a safety plate and a safety mover assembly. The safety plate catches the stage in the event the stage bearing assembly fails. The safety mover assembly moves the safety plate towards the guide base and lifts the stage until the gap is sufficiently small so that the stage bearing assembly can support the stage, at which point the stage plate lowers to prevent contact with the stage.

Alternately, the safety stop can be fixed in height and the guide base is lowered down until the gap is sufficiently small so that the stage bearing assembly can support the stage. Subsequently, the guide base is raised back to its operating position.

Still alternately, in the second embodiment, the guide base is positioned below the stage and the electrostatic force generated by the stage bearing assembly urges the stage downward towards the guide base. Further, in this embodiment, the stage bearing assembly includes a relatively low stiffness fluid bearing that urges the stage upward and away from the guide base in order to balance the electrostatic attractive force. In this design, the overall bearing stiffness is again provided by actively controlling the electrostatic force.

Additionally, in each embodiment, the stage assembly preferably includes a stage mover assembly connected to the stage that moves the stage relative to the guide base. The stage mover assembly can move the stage along an X axis, along a Y axis and about a Z axis relative to the guide base. As provided herein, the stage mover assembly includes a Y mover that moves the stage along the Y axis. The Y mover includes a magnet that is substantially fixed relative to the guide base and a conductor that is secured to the stage. The magnet has a magnet length that extends along the X axis and the conductor has a conductor length along the X axis.

Preferably, the magnet length is greater than the combination of the length of the conductor and the length of the stroke of the stage mover assembly along the X axis. This design of the Y mover eliminates the need to move the magnets of the Y mover as the stage is moved along the X axis. Stated another way, the magnets of the Y mover remain substantially in the same position during movement of the stage along the X axis. Because magnetic fields from the magnets can influence the energy beam from a charge particle exposure apparatus, it is preferable to maintain the magnets in a fixed position so that the influence from the magnets is constant and can be compensated. Thus, the mover provided herein is particularly useful in manufacturing, measurement and/or inspection processes that are sensitive to and/or influenced by stray changing magnetic fields.

The present invention is also directed to a method for making a stage assembly, a method for making an exposure apparatus and a method for making an object utilizing the exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 6AA is an alternate embodiment of the Y mover of FIG. 6A;

FIG. 6BB is a cut away view of an alternate embodiment of a portion of a Y mover of FIG. 6B;

DESCRIPTION

Figure 1:
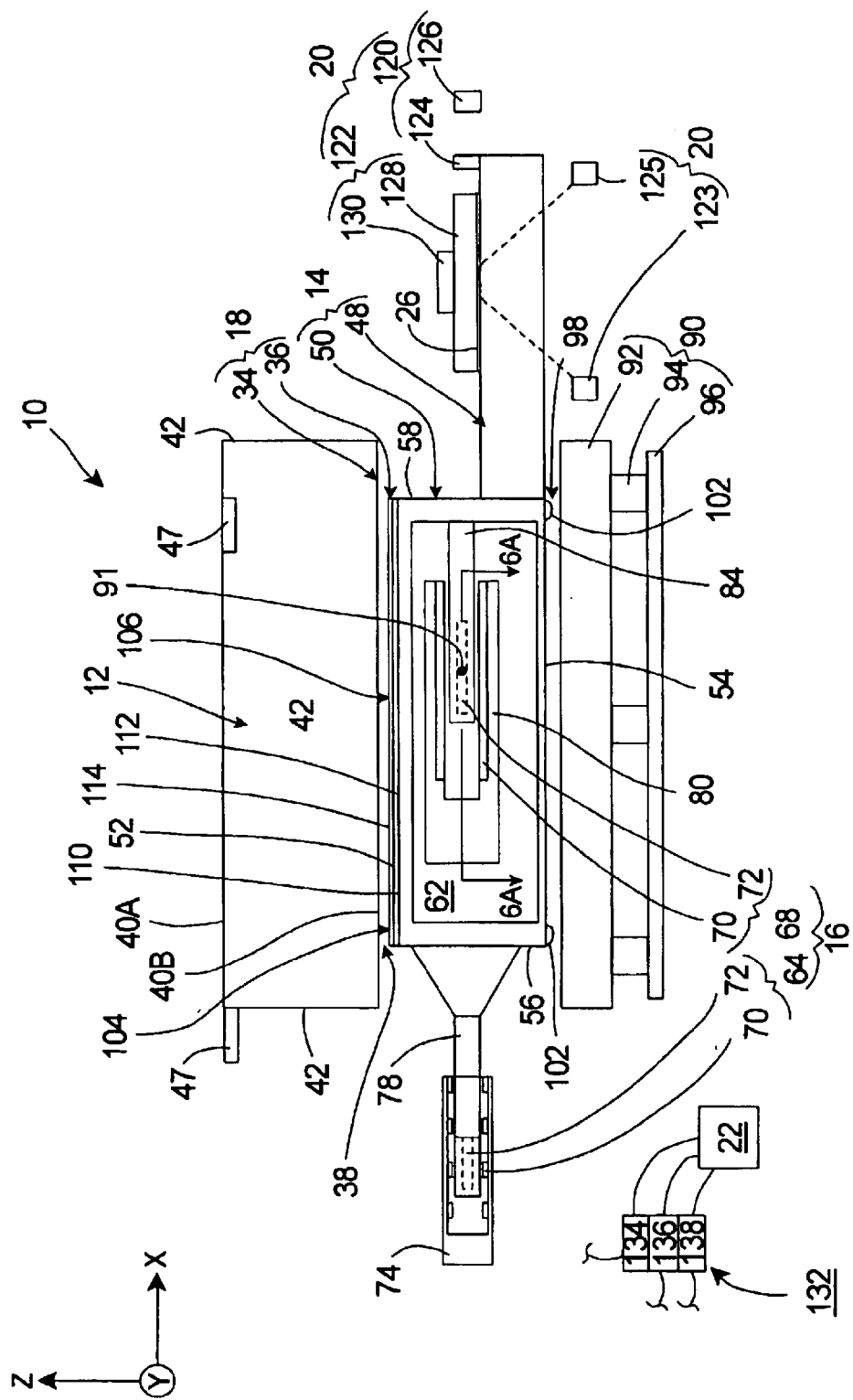
FIG. 1 is a side plan view of a stage assembly having features of the present invention.
Figure 2:
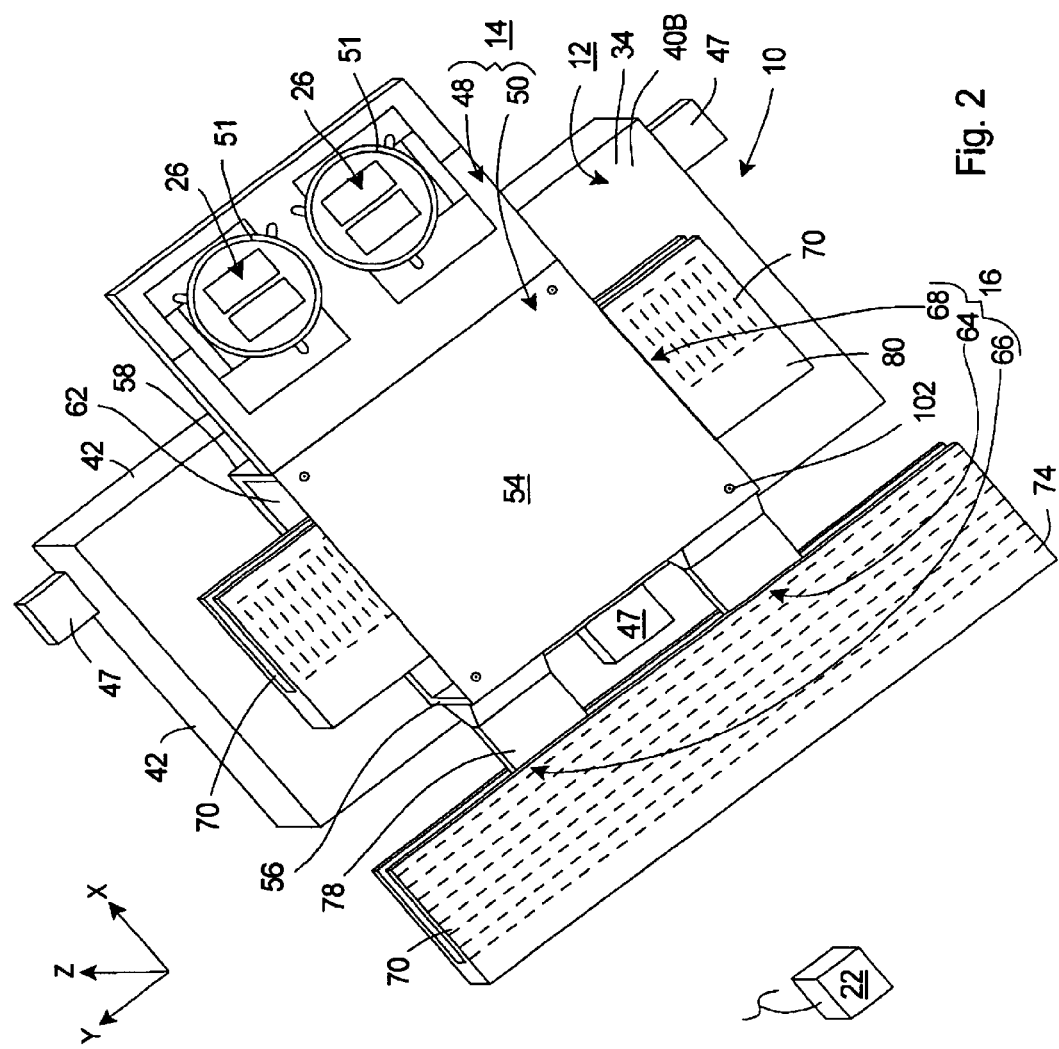
FIG. 2 is a bottom perspective view of the stage assembly of FIG. 1, without a safety stop.

Referring initially to FIGS. 1 and 2, a stage assembly 10 having features of the present invention, includes a guide base 12, a stage 14, a stage mover assembly 16, a stage bearing assembly 18, a measurement system 20 (illustrated in FIG. 1), and a control system 22. The stage assembly 10 is positioned above a mounting base 24 (illustrated in FIG. 8). As an overview, the stage mover assembly 16 precisely moves the stage 14 relative to the guide base 12. Further, the stage bearing assembly 18 supports the stage 14 and allows the stage 14 to move relative to the guide base 12. Uniquely, the control system 22 can control the stage bearing assembly 18 to be relatively stiff, without a vacuum preload, without gas leakage and without mechanical contact.

The stage assembly 10 is particularly useful for precisely positioning one or more devices 26 during a manufacturing and/or an inspection process in a controlled environment, such as a vacuum. The type of device 26 positioned and moved by the stage assembly 10 can be varied. For example, each of the devices 26 can be a reticle and the stage assembly 10 can be used as part of an exposure apparatus 30 (illustrated in FIG. 8) for precisely positioning the reticles 26 during manufacturing of a semiconductor wafer 32. Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

In the embodiments illustrated herein, the stage 14 is moved relative to the guide base 12 (i) along the X axis, the Y axis, and the Z axis and (ii) about the X axis, the Y axis and the Z axis (collectively "the six degrees of freedom"). Additionally, the stage assembly 10 could be designed to include two or more stages that are moved independently.

As an overview, in the embodiments provided herein, the stage bearing assembly 18 includes a base conductive section 34 and a stage conductive assembly 36. The base conductive section 34 and the stage conductive assembly 36 cooperate to support the stage 14 spaced apart a gap 38 from the guide base 12 along the Z axis. The term gap 38 is also referred to as the flying height. Further, the base conductive section 34 and the stage conductive assembly 36 cooperate to allow for motion of the stage 14 relative to the guide base 12.

In the embodiment illustrated in FIGS. 1 and 2, an upward, attractive, electrostatic force acts on the stage 14 when a voltage difference is applied to the base conductive section 34 and the stage conductive assembly 36 by the control system 22. In this design, the weight of the stage 14 due to gravity, applies a downward force on the stage 14. The control system 22 controls voltage to the stage conductive assembly 36 to balance the upward, electrostatic force and the downward force of the weight of the stage 14 to support the stage 14 spaced apart the desired gap 38 from the guide base 12.

Preferably, the control system 22 controls voltage to the stage bearing assembly 18 to adjust the position of the stage 14 relative to the guide base 12 along the Z axis, about the X axis and about the Y axis. More specifically, the control system 22 controls the voltage of the stage conductive assembly 36 to control the size of the gap 38, correct the position of the stage 14 along the Z axis, about the X axis, and about the Y axis, and obtain the desired stiffness of the bearing.

The guide base 12 supports a portion of the stage assembly 10 above the mounting base 24. The design of the guide base 12 can be varied to suit the design requirements of the stage assembly 10. In the embodiment illustrated in FIGS. 1 and 2, the guide base 12 is generally rectangular shaped and includes a base top 40A, an opposed, planar base bottom 40B (sometimes referred to as a guide face), and four base sides 42.

Figure 3:
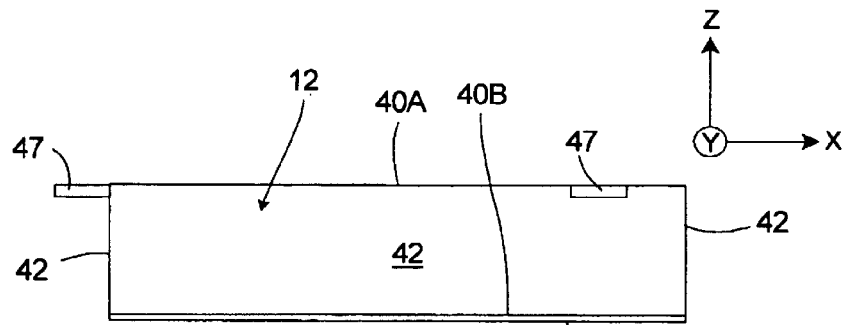
FIG. 3 is a side plan view of a guide base having features of the present invention.

In the embodiment illustrated in FIGS. 1 and 2, the guide base 12 defines the base conductive section 34. In this design, the guide base 12 is made of a conductive material or semi-conductive material. Alternately, referring to FIG. 3, the guide base 12 can include a layer 43 of conductive or semi-conductive material deposited at the base bottom 40B of the guide base 12 that defines the base conductive section 34. In this design, the rest of the guide base 12 can be made of a substantially non-conductive material.

Figure 8:
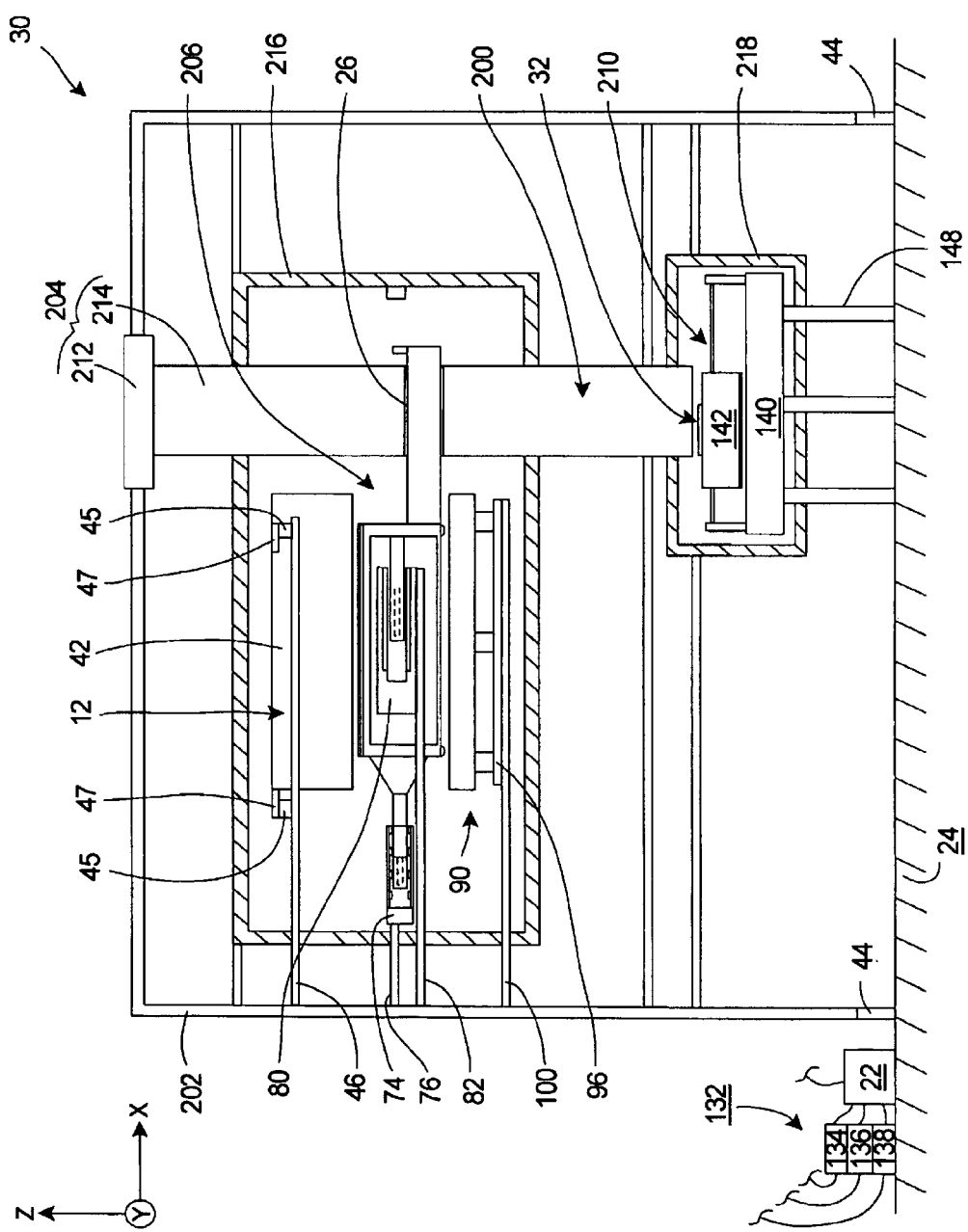
FIG. 8 is a side illustration of an exposure apparatus having features of the present invention.

Preferably, referring to FIG. 8, the guide base 12 is secured with base movers 45 and a base frame 46 to an apparatus frame 202 and the mounting base 24. Additionally, apparatus isolators 44 are used to secure the apparatus frame 202 to the mounting base 24. In this design, the guide base 12 includes a plurality of spaced apart base tabs 47 that cantilever away from the base sides 42 of the guide base 12. Alternately, for example, the base frame 46 can be secured directly to the base top 40A of the guide base 12. The base movers 45 are positioned between the base tabs 47 and the base frame 46. The apparatus isolators 44 reduce the effect of vibration of the mounting base 24 causing vibration on the apparatus frame 202 and the guide base 12. The base movers 45 can be used to adjust the position of the guide base 12 and the stage 14 relative to the apparatus frame 202 (i) along the X axis, the Y axis and the Z axis and (ii) about the X axis, the Y axis and the Z axis.

In this design, the apparatus frame 202 supports the stage assembly 10 and other components of the exposure apparatus 30 above the mounting base 24. In this design, the apparatus frame 202 and the components that the apparatus frame 202 supports are isolated by the apparatus isolators 44 from mounting base 24 vibration. Alternately, for example, it is also possible for different subassemblies of the exposure apparatus 30 to be independently isolated from mounting base 24 vibration. However, this can be difficult in a vacuum environment.

Typically, three spaced apart apparatus isolators 44 (only two are illustrated in FIG. 8) and three spaced apart base movers 45 (only two are illustrated in FIG. 8) are utilized. Each of the apparatus isolators 44 for example, can include a pneumatic cylinder or a spring. Each of the base movers 45 can include one or more rotary motors, voice coil motors, linear motors, electromagnetic actuators, hydraulic actuators, screw type actuators, or other type of actuators. Depending upon the type of actuator utilized, it may be desirable to provide a spring or other type of device to carry the static weight so that required actuator power is minimized.

The stage 14 is precisely supported and positioned relative to an optical assembly 200 or some other reference to precisely position the device 26. As provided herein, the stage mover assembly 16 is used to move and position the stage 14 along the X axis, along the Y axis and about the Z axis independent of the stage bearing assembly 18.

Further, the stage bearing assembly 18 and/or the base movers 45 are used to position and move the stage 14 along the Z axis, about the X axis and about the Y axis. For example, the stage bearing assembly 18 can be designed to operate over a relatively large (e.g. 100–200 micrometers) range. In this design, the stage bearing assembly 18 can be used to completely control the position of the stage 14 along the Z axis, about the X axis and about the Y axis. Alternately, the stage bearing assembly 18 could be designed to maintain a constant gap 38 and the base movers 45 can be used to position the stage 14 along the Z axis, about the X axis and about the Y axis.

Still alternately, the combination of the stage bearing assembly 18 and the base movers 45 can be used together to position the stage 14 along the Z axis, about the X axis and about the Y axis. In this design, (i) the stage bearing assembly 18 can be used for fast (high frequency, high bandwidth) control of the stage 14 over small ranges along the Z axis, about the X axis and about the Y axis and (ii) the base movers 45 are used to adjust the position of the guide base 12 along the Z axis, about the X axis and about the Y axis so that the stage bearing assembly 18 is always within the desired range. This design is good for correcting for variations between wafers and reticles.

In the design illustrated in FIG. 8, the guide base 12 is not vibration isolated from the apparatus frame 202. The stage bearing assembly 18 provides vibration isolation for the stage 14.

The stage 14 retains one or more devices 26. The design of the stage 14 can be varied to suit the design requirements of the stage assembly 10. In the embodiment illustrated in the Figures, the stage 14 includes a device table 48, a stage body 50, a portion of the stage mover assembly 16, the stage conductive assembly 36, and a portion of the measurement system 20.

The design and movement of the device table 48 can be varied. In the embodiment illustrated in the Figures, the device table 48 is generally flat plate shaped and cantilevers away from the stage body 50. Further, the device table 48 includes two spaced apart device holders (not shown), a pair of table apertures 51 that extend through the device table 48, and a portion of the measurement system 20. Each of the device holders retains one device 26 above one table aperture 51 during movement of the stage 14. Each of the device holders can be a vacuum chuck, an electrostatic chuck, or some other type of clamp. However, the number of reticle holders can be increased or decreased.

The size of the device table 48 can be varied. For an exposure apparatus 30, the device table 48 can be approximately 400 mm to 800 mm long, 400 mm to 800 mm wide, and 25 mm to 100 mm in thickness.

The design of the stage body 50 can be varied. In the embodiment illustrated in the Figures, the stage body 50 includes (i) a flat housing top 52, (ii) a flat housing bottom 54 that is substantially parallel with the housing top 52, (iii) a first housing side 56 that extends between the housing top 52 and the housing bottom 54, and (iv) a second housing side 58 that is substantially parallel with the first housing side 56.

Figure 4:
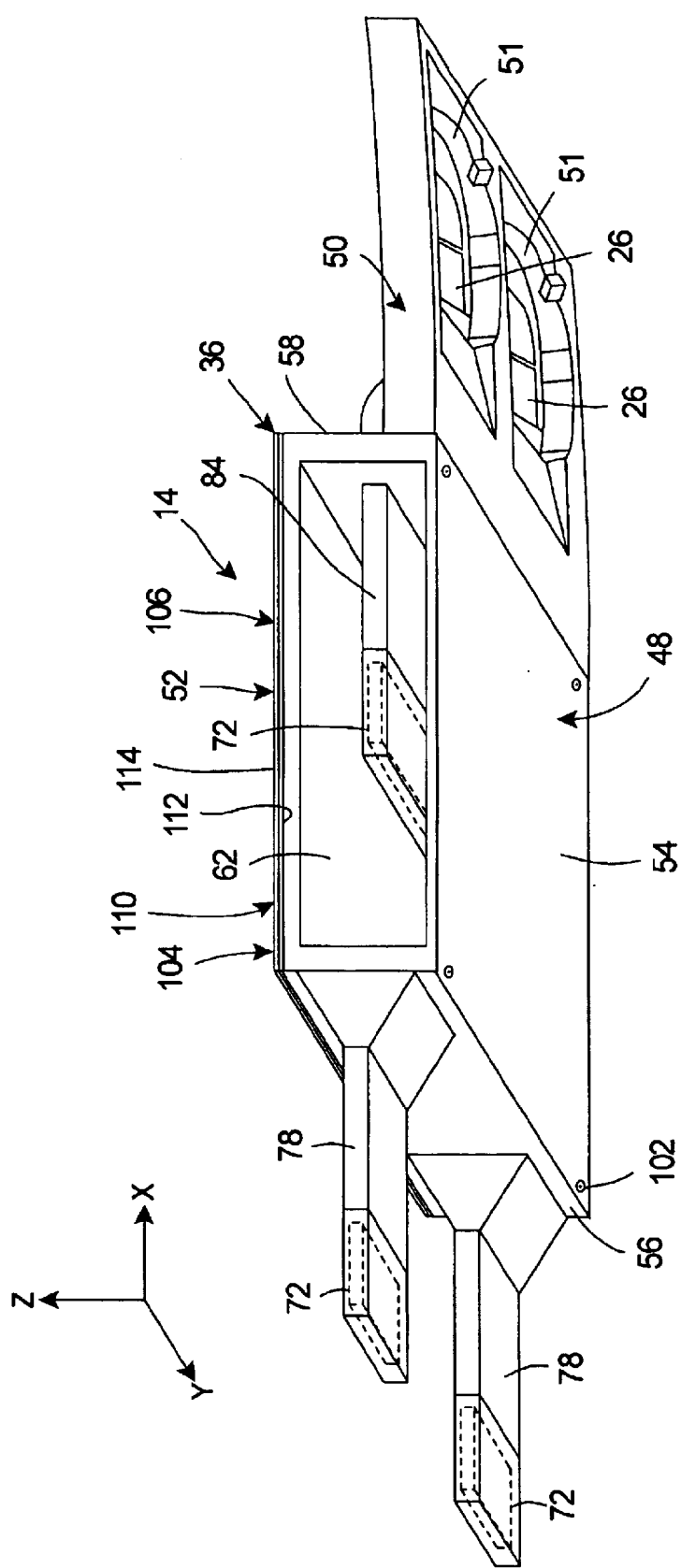
FIG. 4 is a bottom perspective view of a stage having features of the present invention.

The housing top 52, the housing bottom 54 and the housing sides 56, 58 cooperate to form a generally rectangular tube shaped structure that defines a guide opening 62. The guide opening 62 is sized and shaped to encircle a portion of the stage mover assembly 16. In the embodiment illustrated in the Figures, the guide opening 62 is generally rectangular shaped and extends longitudinally along the stage body 50. Further, referring to FIGS. 4 and 5, the device table 48 cantilevers from the second housing side 58 near the housing bottom 54. Further, the stage conductive assembly 36 is secured to and/or is positioned at the housing top 52.

The components of the stage 14 can be made of a number of materials including ceramic, such as alumina or silicon carbide; metals such as aluminum; composite materials; or plastic. Preferably, the stage body 50 is made of a substantially non-conductive material so that the stage conductive assembly 36 is electrically isolated from the rest of the stage 14.

The stage mover assembly 16 controls and moves the stage 14 relative to the guide base 12 along the X axis, along the Y axis, and about the Z axis. More specifically, the stage mover assembly 16 moves and positions the stage 14 along the X axis, along the Y axis, and about the Z axis under the control of the control system 22.

The design of the stage mover assembly 16 and the movement of the stage 14 can be varied to suit the movement requirements of the stage assembly 10. In the embodiment illustrated in FIGS. 1 and 2, the stage mover assembly 16 moves the stage 14 with a relatively moderate displacement along the X axis, a relatively large displacement along the Y axis, and a limited displacement about the Z axis (theta Z) relative to the guide base 12. In this embodiment, the stage mover assembly 16 includes a first X housing mover 64, a second X housing mover 66 and a Y mover 68. The two X housing movers 64, 66 cooperate to move the stage body 50 along the X axis and about the Z axis. The Y mover 68 moves the stage body 50 along the Y axis.

The design of each of the housing movers 64, 66, 68 can be varied to suit the movement requirements of the stage assembly 10. For example, each of the housing movers 64, 66, 68 can include one or more rotary motors, voice coil motors, linear motors, electromagnetic actuators, or other type of actuators. As provided herein, each of the housing movers 64, 66, 68 includes a reaction component 70 and an adjacent moving component 72 that interacts with the reaction component 70. In the embodiments provided herein, for each of the housing movers 64, 66, 68, one of the components 70, 72 includes one or more magnet arrays (not shown) and the other component 70, 72 includes one or more conductor arrays (not shown).

Each magnet array includes one or more magnets. The design of each magnet array and the number of magnets in each magnet array can be varied to suit the design requirements of the housing movers 64, 66, 68. Each magnet can be made of a permanent magnetic material such as NdFeB. Each conductor array includes one or more conductors. The design of each conductor array and the number of conductors in each conductor array is varied to suit the design requirements of the housing movers 64, 66, 68. Each conductor can be made of metal such as copper or any substance or material responsive to electrical current and capable of creating a magnetic field such as superconductors.

Electrical current (not shown) is supplied to the conductors in each conductor array by the control system 22. For each housing mover 64, 66, 68, the electrical current in the conductors interacts with the magnetic field(s) generated by the one or more of the magnets in the magnet array. This causes a force (Lorentz type force) between the conductors and the magnets that can be used to move the stage 14 relative to the guide base 12.

Specifically, the reaction component 70 and the moving component 72 of each X housing mover 64, 66 interact to selectively move the stage body 50 along the X axis and about the Z axis relative to the guide base 12. In the embodiment illustrated in FIGS. 1 and 2, each X housing mover 64, 66 is somewhat similar to a commutated, voice coil motor. Further, in the embodiment illustrated in FIGS. 1 and 2, the X housing movers 64, 66 share the same reaction component 70. In this embodiment, the reaction component 70 includes a pair of spaced apart magnet arrays that are secured to a generally "C" shaped X reaction housing 74. As illustrated in FIG. 1 and in phantom in FIG. 2, the magnets of the shared reaction component 70 of the X housing movers 64, 66 extend longitudinally along the reaction housing 74.

Referring to FIG. 8, the X reaction housing 74 can be secured to the apparatus frame 202 and the mounting base 24 with an X beam 76. Alternately, for example, the X reaction housing 74 can be secured to the mounting base 24 with a reaction frame or the X reaction housing 74 can be secured to a reaction mass.

Also, in the embodiment illustrated in the Figures, the moving component 72 for each of the X housing movers 64, 66 includes a separate conductor array that is supported by a generally rectangular shaped, X array support 78 and positioned between the magnet arrays. In this design, each of the X array supports 78 is secured to and cantilevers away from the first housing side 56 of the stage body 50. With this design, the moving component 72 of each X housing mover 64, 66 is secured to the stage body 50. The length of the X array support 78 depends upon the desired stroke of the X housing movers 64, 66 along the X axis.

Alternately, for example, the X housing movers 64, 66 could be designed so that the reaction component 70 includes a conductor array while the moving component 72 includes a pair of spaced apart magnet arrays.

The required stroke 87 of the X housing movers 64, 66 along the X axis will vary according to desired use of the stage assembly 10. For an exposure apparatus 30, generally, the X stroke 87 of the X housing movers 64, 66 for moving the reticles 26 is between approximately zero millimeters and two hundred millimeters.

The X housing movers 64, 66 also make relatively slight adjustments to position of the stage body 50 about the Z axis. In order to make the adjustments about the Z axis, the moving component 72 of one of the X housing movers 64, 66 is moved relative to the moving component 72 of the other X housing mover 64, 66. Stated another way, a first X housing mover 64 generates a different force than the second X housing mover 66. With this design, the X housing movers 64, 66 generate torque about the Z axis.

The Y mover 68 selectively moves the stage body 50 with a relatively large displacement along the Y axis relative to the guide base 12. More specifically, the reaction component 70 and the moving component 72 of the Y mover 68 interact to selectively move the stage body 50 along the Y axis relative to the guide base 12. In the embodiment illustrated in FIGS. 1 and 2, the Y mover 68 is a commutated, linear motor that is positioned within the guide opening 62. The reaction component 70 includes a pair of spaced apart magnet arrays that are secured to a generally "C" shaped, Y reaction housing 80.

Referring to FIG. 8, the Y reaction housing 80 can be secured to the apparatus frame 202 and the mounting base 24 with a Y beam 82. Alternately, for example, the Y reaction housing 80 can be secured to the mounting base 24 with a reaction frame or the Y reaction housing 80 can be secured to a reaction mass.

Also as illustrated in FIG. 1, the moving component 72 for the Y mover 68 includes a conductor array that is supported by a generally rectangular shaped Y array support 84 and positioned between the magnet arrays. In this design, the Y array support 84 cantilevers into the guide opening 62 and is secured to the second housing side 58 of the stage body 50. With this design, the moving component 72 of the Y mover 68 is secured to the stage body 50 and positioned between the reaction component 70. The length of the Y array support 84 depends upon the X stroke 87 of the X housing movers 64, 66 along the X axis.

With this design, the Y mover 68 makes relatively large displacement adjustments to the position of the stage body 50 along the Y axis. The required stroke of the Y mover 68 along the Y axis will vary according to desired use of the stage assembly 10. For an exposure apparatus 30, generally, the Y stroke of the Y movers 68 for moving the reticles 26 is between approximately two hundred and fifty millimeters and seven hundred and fifty millimeters.

It should be noted that the magnets (illustrated in phantom in FIG. 2) in the reaction component 70 of the Y mover 68 extend substantially perpendicular to a longitudinal axis of the Y mover 68 and substantially perpendicular to the magnets in the combined reaction component 70 of the XZ housing movers 64, 66.

Figure 6A:
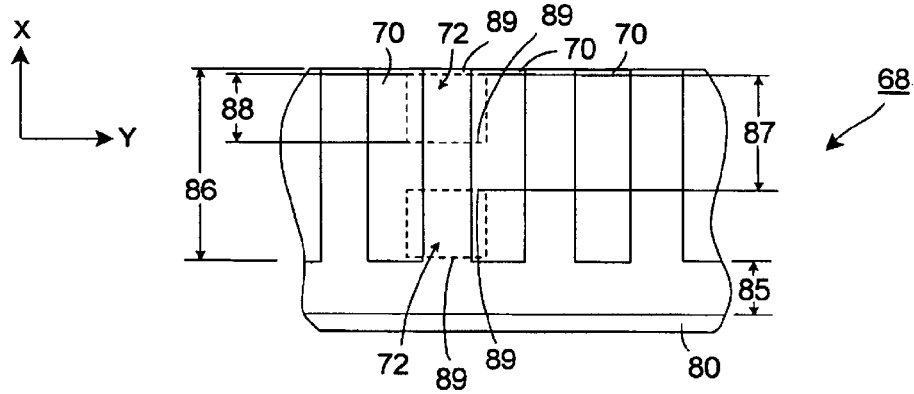
FIG. 6A is a cut away view of a portion of a Y mover taken on line 6A—6A in FIG. 1.
Figure 6A:
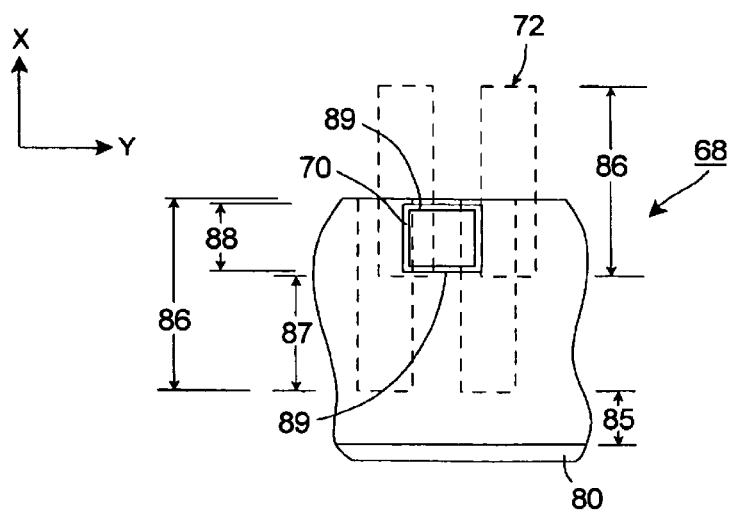

Importantly, referring to FIG. 6A, the magnets in the reaction component 70 of the Y mover 68 are relatively long in the X axis. More specifically, a magnet length 86 of the magnets of the Y mover 68 along the X axis is long enough that the Y mover 68 can provide a Y force over the range of the X positions of the Y mover 68. It should be noted in FIG. 6A that the conductor array is illustrated in phantom at each end of the X stroke 87 to illustrate the movement of the conductor array along the X axis.

As provided herein, referring to FIG. 6A, the magnet length 86 is equal to or greater than the combination of (i) a conductor length 88 of the conductor array along the X axis plus (ii) the X stroke 87 of the X housing movers 64, 66 during normal operation. Also, the magnet length 86 could be at least five percent or more greater than the combination of the conductor length 88 plus the X stroke 87. Further, it should be noted that the magnets are positioned a safety gap 85 away from a back of the Y reaction housing 80 to allow for extra mechanical stroke for safety. This design allows the conductor array of the moving component 72 of the Y mover 68 to effectively interact with the magnets of the reaction component 70 of the Y mover 68 as the stage 14 is moved along a normal stroke along the X axis of the stage 14. Stated another way, the conductor array remains completely between the magnets throughout the complete normal movement of the stage 14 along the X axis. As a result thereof, both ends 89 of the conductor array remain within the magnets so that the forces along the X axis that are generated by the ends 89 of the conductor array are cancelled out.

This design eliminates the need to move the magnets of the Y mover 68 as the stage 14 is moved along the X axis by the housing movers 64, 66. Stated another way, the magnets of the Y mover 68 remain substantially in the same position during movement of the stage 14 along the X axis. Because magnetic fields from the magnets can influence the energy beam from a charge particle exposure apparatus 30, it is preferably to maintain the magnets in a fixed position so that the influence from the magnets is constant and can be compensated for.

Alternately, as illustrated in FIG. 6AA, the Y movers 68 could be designed so that the reaction component 70 includes a pair of spaced apart conductor arrays (only one conductor array is illustrated in FIG. 6AA) while the moving component 72 includes a magnet array. It should be noted in FIG. 6AA that the magnet array is illustrated in phantom at each end of the X stroke to illustrate the movement of the magnet array along the X axis.

In this design, the magnet length 86 is again equal to or greater the combination of (i) a conductor length 88 of the conductor array plus (ii) the X stroke 87 of the X housing mover 64, 66 during normal operation. This design allows the conductor array of the reaction component 70 of the Y mover 68 to effectively interact with the magnets of the moving component 72 of the Y mover 68 as the stage 14 is moved along a normal stroke along the X axis of the stage 14. Stated another way, the conductor array remains completely between the magnets throughout the complete normal movement of the stage 14 along the X axis. As a result thereof, both ends 89 of the conductor array remain within the magnets so that the forces along the X axis that are generated by the ends 89 of the conductor array are cancelled out. However, the design illustrated in FIG. 6AA is believed to be less desirable because of the moving magnetic fields from the moving magnets.

Figure 6B:
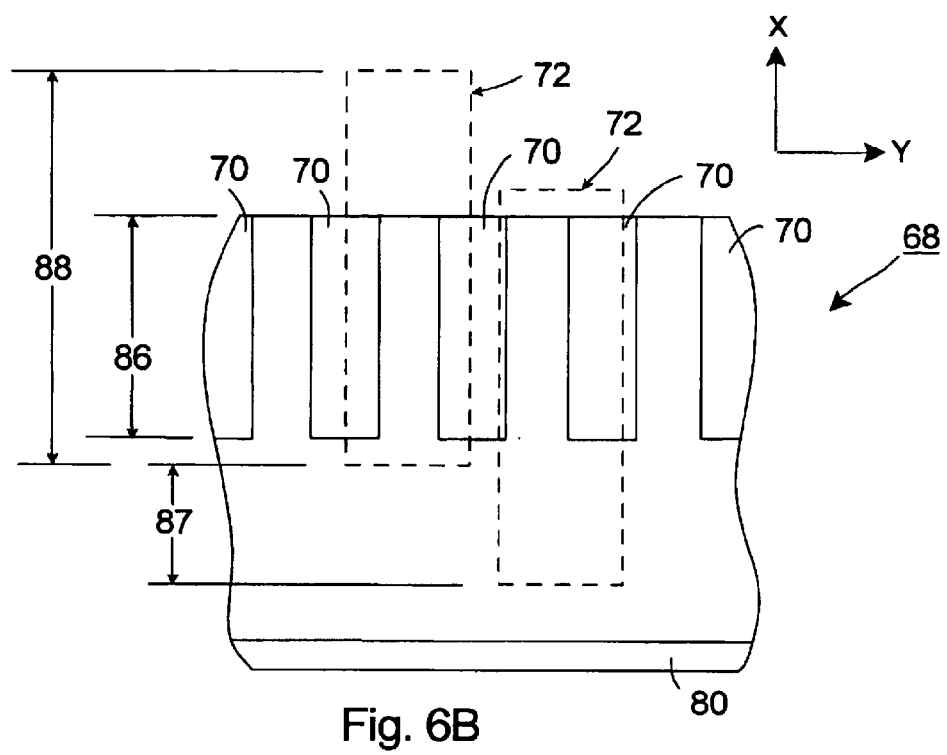
FIG. 6B is a cut away view of another embodiment of a portion of a Y mover having features of the present invention.
Figure 6B:
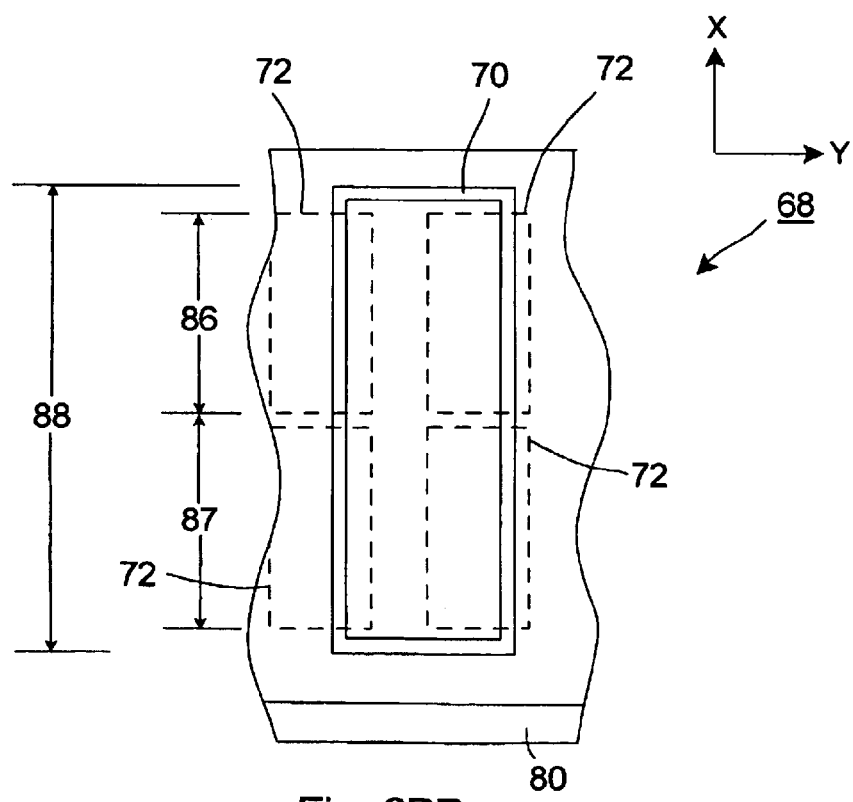

FIG. 6B illustrates another embodiment of a Y mover 68 having features of the present invention. In this embodiment, the reaction component 70 includes a pair of magnet arrays (only one is illustrated) and the moving component 72 includes a conductor array. Is should be noted in FIG. 6B that the conductor array is illustrated in phantom at each end of the X stroke to illustrate the movement of the conductor array along the Y axis. As illustrated in FIG. 6B, the magnets are relatively short and the conductor array relative long. More specifically, the conductor length 88 of the conductor array is equal to or greater than the combination of the magnet length 86 plus the X stroke 87. However, this design is not as efficient and it may require that the Y reaction housing 80 be deeper and the Y array support (not shown in FIG. 6B) be longer.

FIG. 6BB illustrates yet another embodiment of a Y mover 68 having features of the present invention. In this embodiment the reaction component 70 includes a pair of spaced apart conductor arrays (only one is illustrated) and the moving component 72 includes a magnet array. It should be noted in FIG. 6BB that the magnet array is illustrated in phantom at each end of the X stroke 87 to illustrate the movement of the magnet array along the X axis. As illustrated in FIG. 6BB, the magnets are relatively short and the conductor array relative long. Further, the conductor length 88 is equal to or greater than the combination of the magnet length 86 plus the X stroke 87.

Preferably, the housing movers 64, 66, 68 are positioned to push through a stage center of gravity 91 (illustrated in FIG. 1) of the stage 14. In the embodiment illustrated herein, the housing movers 64, 66, 68 are positioned at approximately the same height along the Z axis as the stage center of gravity 91. Further, the moving component 72 of the Y mover 68 is positioned on the stage center of gravity 91 regardless of the position of the stage 14 along the X axis. This minimizes the amount of tilt and yaw experienced by the stage 14 during acceleration by the stage mover assembly 16.

Stated another way, the Y mover 68 is preferably located so that the Y force vector is aligned with the stage center of gravity 91. Likewise, the two X housing movers 64, 66 are located to drive in the XY plane of the stage center of gravity 91. In this way, disturbances transferred to the stage 14 about the X axis and about the Y axis from the two X housing movers 64, 66 are minimized.

Further, the control system 22 can incorporate feed forward corrections during control of the stage bearing assembly 18 to correct any predictable or repeatable disturbances created along the Z axis, about the X axis and about the Y axis during acceleration of the stage 14 by the stage mover assembly 16 along the X axis, along the Y axis and about the Z axis.

Preferably, referring to FIGS. 1 and 8, the stage assembly 10 includes a safety stop 90 that catches the stage 14 in the event the stage bearing assembly 18 fails. In the embodiment illustrated in FIGS. 1 and 8, if the stage bearing assembly 18 fails the stage 14 will fall downward until the stage 14 contacts the safety stop 90. Events the could lead to the failure of the stage bearing assembly 18 include temporary loss of power to the stage bearing assembly 18, failure of a portion of the stage bearing assembly 18, and the gap 38 between the base conductive section 34 and the stage conductive assembly 36 becomes too large and requires too much voltage to maintain the attractive force generated by the electrostatic bearing.

The safety stop 90 minimizes damage to the stage 14 in the event of failure of the stage bearing assembly 18. Preferably, the safety stop 90 also repositions the stage 14 so that the stage bearing assembly 18 can be reengaged. In the embodiment illustrated in FIG. 1, the safety stop 90 includes a safety plate 92, a safety mover assembly 94 and a safety base 96 that are positioned below the stage body 50 a safety gap 98. In this embodiment, the safety plate 92 is generally rectangular shaped and is positioned directly below the stage body 50. In this position, the safety plate 92 can engage the stage body 50 in the event that the stage bearing assembly 18 fails. The safety base 96 is also generally rectangular shaped and is positioned below the safety plate 92. Referring to FIG. 8, the safety base 96 can be secured to the apparatus frame 202 and the mounting base 24 with a safety beam 100.

The safety mover assembly 94 moves the safety plate 92 relative to the safety base 96 and the stage body 50 to selectively adjust the safety gap 98 between the safety plate 92 and the housing bottom 54 of the stage body 50. Further, the safety mover assembly 94 can be used to lift and reposition the stage 14 so that the stage bearing assembly 18 can be reengaged. The design of the safety mover assembly 94 can be varied. For example, the safety mover assembly 94 can include one or more rotary motors, voice coil motors, linear motors, electromagnetic actuators, or other type of actuators.

The size of the safety gap 98 between the stage body 50 and the safety plate 92 should be adjusted to be large enough to allow the stage 14 to move freely, but small enough to minimize and prevent damage to the stage 14 if the stage bearing assembly 18 fails. When movement the stage 14 along the Z axis, about the X axis and about the Y axis is relatively small, the safety gap 98 can be small and the safety plate 92 can be maintained in a substantially constant position. Alternately, for example, if movement of the stage 14 along the Z axis, about the X axis and about the Y axis is relatively large, the safety plate 92 should also be moved along the along the Z axis, about the X axis and about the Y axis by the safety mover assembly 94 to substantially mirror the movement along the Z axis, about the X axis and about the Y axis of the stage 14. With this design, the safety gap 98 remains small despite relatively large vertical movement of the stage 14. Alternately, for example, the base movers 45 can be used to move the guide base 12 and the stage 14 to maintain the desired safety gap 98 and/or to lower the guide base 12 so that the stage support assembly 18 can be reengaged.

In operation, if the electrostatic force of the stage bearing assembly 18 fails to support the stage 14, the stage 14 falls onto the safety plate 92. If the gap 38 between the base conductive section 34 and the stage conductive assembly 36 is too large, the control system 22 amplifiers may be voltage limited and the electrostatic attraction of the stage bearing assembly 18 will not be able to lift the stage 14 off of the safety plate 92. Subsequently, the gap 38 can be reduced until the base conductive section 34 and the stage conductive assembly 36 are close enough so that the electrostatic attraction will support the stage 14 above the safety plate 92. As discussed above, the gap 38 can be reduced by lifting the stage 14 with the safety mover assembly 94 and/or by lowering the guide base 12 with the base movers 45.

Additionally, the stage body 50 preferably includes a plurality of spaced apart, housing pads 102 that extend downwardly from the housing bottom 54. The housing pads 102 minimize friction, damage, and particle generation in the event the stage 14 drops while moving. The housing pads 102 can be made of a low-friction and low-particle-producing material.

The stage bearing assembly 18 supports the stage 14 spaced apart from the guide base 12. As provided herein, the stage bearing assembly 18 generates an electrostatic force along the Z axis that allows the stage 14 to move relative to the guide base 12 along the X axis, along the Y axis and about the Z axis. The design of the support assembly 18 can be varied to suit the design requirements of the stage assembly 10. As provided above, in the embodiment illustrated in FIGS. 1 and 2, the support assembly 18 includes the base conductive section 34 and the stage conductive assembly 36 that cooperate to generate an electrostatic attraction force that urges the stage 14 upwardly. In the embodiments illustrated herein, the base conductive section 34 and the stage conductive assembly 36 form generally parallel plates. The upward, attractive, electrostatic force acts on the stage 14 when a voltage difference is applied to the base conductive section 34 and the stage conductive assembly 36 by the control system 22. Stated another way, the attractive electrostatic force acts between the stage 14 and the guide base 12 when the base conductive section 34 and the stage conductive section 36 have a difference in charge.

In this design, the weight of the stage 14 due to gravity, applies a downward force on the stage 14. As provided in detail below, the control system 22 controls voltage to the stage bearing assembly 18 to balance the upward, electrostatic force of the stage bearing assembly 18 and the downward force of the weight of the stage 14 to support the stage 14 spaced apart from the guide base 12, to achieve the desired gap 38 and to achieve the desired stiffness and damping.

The design of the base conductive section 34 can be varied. For example, in the embodiment illustrated in FIGS. 1 and 2, the guide base 12 defines the base conductive section 34. In this design, the guide base 12 is made of a conductive material or semi-conductive material. Alternately, referring to FIG. 3, the guide base 12 can include the layer 43 of conductive or semi-conductive material deposited at the base bottom 40B of the guide base 12 that defines the base conductive section 34. The layer 43 is conductive or semi-conductive to permit the voltage across the layer 43 to be controlled to any desired level and to permit the layer 43 to become electrically charged. When the base conductive section 34 is electrically charged, it is surrounded by a base electrostatic field. The magnitude of the base electrostatic field depends upon the voltage applied to the base conductive section 34.

Figure 5:
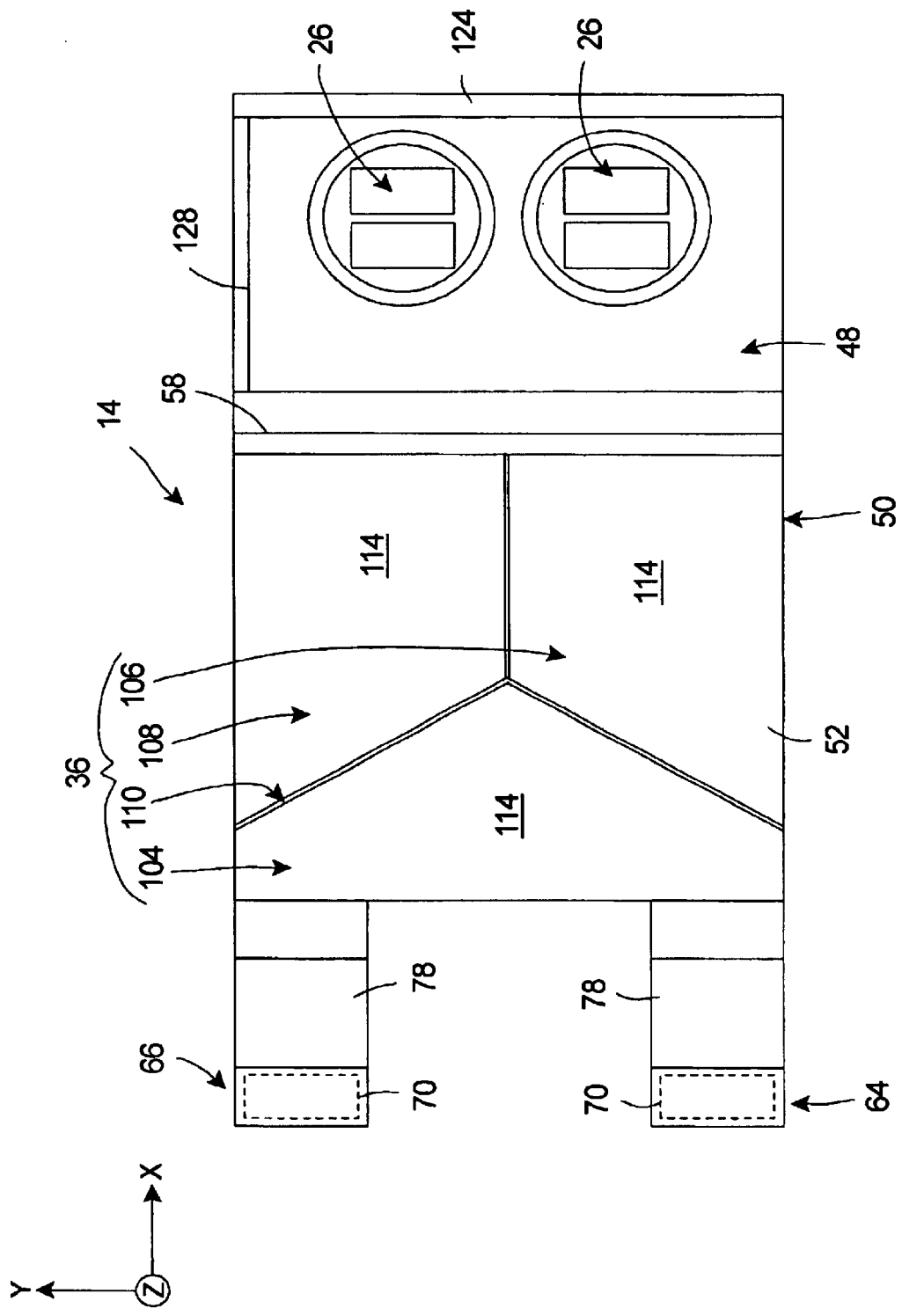
FIG. 5 is a top plan view of the stage of FIG. 4.

The stage conductive assembly 36 moves with and is secured to the housing top 52 of the stage body 50. As provided herein, the stage conductive assembly 36 interacts with the base conductive section 34 to generate an electrostatic attraction force. The design of the stage conductive assembly 36 can be varied. For example, as illustrated in FIG. 5, the stage conductive assembly 36 can include a first stage conductive section 104, a second stage conductive section 106, a third stage conductive section 108, and an isolator 110. Alternately, the stage conductive assembly 36 can include more than three or less that three stage conductive sections. When the stage conductive sections 104, 106, 108 are electrically charged, they are surrounded by a stage electrostatic field. The magnitude of the stage electrostatic field depends upon the voltage applied to the stage conductive sections 104, 106, 108.

In this embodiment, each of the stage conductive sections 104, 106, 108 interacts with the base conductive section 34 to generate an independent electrostatic force when a differential voltage is applied to between the base conductive section 34 and each of the stage conductive sections 104, 106, 108 by the control system. An attractive electrostatic force is generated when the base conductive section 34 is oppositely charged from each of the stage conductive sections 104, 106, 108. Referring to FIG. 5, the first stage conductive section 104 is somewhat triangular shaped and the second and the third stage conductive sections 106, 108 are each somewhat trapezoidal shaped. Each of the stage conductive sections 104, 106, 108 is generally parallel with the base conductive section 34.

In this embodiment, the stage body 50 is preferably made of a non-conductive material to isolate the stage conductive sections 104, 106, 108. As provided herein, each of the stage conductive sections 104, 106, 108 includes a conducting layer 112 disposed on the housing top 52 of the stage body 50. The conducting layer 112 typically includes a metal. Preferably, each of the stage conductive sections 104, 106, 108 can include a dielectric film 114 that covers the conducting layer 112. Each of the conducting layers 112 can have a low capacitance to provide a height servo bandwidth without requiring excessive current from the control system 22.

The isolator 110 substantially inhibits the flow of voltage between each of the stage conductive sections 104, 106, 108. The isolator 110 can be a thin strip that is made of any non-conductive material. For example, the isolator 110 can be made of a ceramic material. Alternately, the isolator 110 can be a gap or space between the stage conductive sections 104, 106, 108. In the embodiment illustrated in FIG. 5, the isolator 110 is somewhat Y shaped.

The measurement system 20 monitors movement of the stage 14 relative to the guide base 12, or to some other reference such as an optical assembly 200 (illustrated in FIG. 8). With this information, the stage mover assembly 16 and the stage bearing assembly 18 can be used to precisely position the stage 14. The design of the measurement system 20 can be varied. For example, the measurement system 20 can utilize laser interferometers, encoders, and/or other measuring devices to monitor the position of the stage 14.

Typically, the measurement system 20 monitors the position of the device table 48 (i) along the X axis, along the Y axis, and about the Z axis relative to the optical assembly 200 or some other reference and (ii) along the Z axis, about the X axis and about the Y axis relative to the optical assembly 200, the wafer stage and/or some other reference. In the embodiment illustrated in the Figures, the measurement system 20 includes an X interferometer 120, a Y interferometer 122, and a Z sensor 123. The X interferometer 120 includes an X mirror 124 and an X block 126. The X block 126 interacts with the X mirror 124 to monitor the location of the device table 48 along the X axis and about the Z axis (theta Z). More specifically, the X block 126 generates a pair of spaced apart laser signals (not shown) that are reflected off of the X mirror 124. With this information, the location of the device table 48 along the X axis and about the Z axis can be monitored.

In the embodiment illustrated in the Figures, the X mirror 124 is rectangular shaped and is secured along one side of the device table 48. The X block 126 is positioned away from the device table 48. The X block 126 can be secured to the apparatus frame 202 or some other location that is isolated from vibration.

Somewhat similarly, the Y interferometer 122 includes a Y mirror 128 and a Y block 130. The Y mirror 128 interacts with the Y block 130 to monitor the position of the device table 48 along the Y axis. More specifically, the Y block 130 generates a laser signal that is reflected off of the Y mirror 128. With this information, the location of the device table 48 along the Y axis can be monitored.

In the embodiment illustrated in the Figures, the Y mirror 128 is rectangular shaped and is secured along one of the sides of the device table 48. The Y block 130 is positioned away from the device table 48. The Y block 130 can be secured to the apparatus frame 202 or some other location that is isolated from vibration.

Somewhat similarly, the Z sensor 123 includes a first Z block 131A and a second Z block 131B. The Z sensor 123 is sometimes referred to as an auto focus sensor. In this design, the Z blocks 131A, 131B generate laser signals that are reflected off of the device 26. With this information, the location of the device 26 along the Z axis, about the X axis and about the Y axis can be monitored.

Additionally, the measurement system 20 includes one or more gap measuring devices 132 for accurately measuring the size of the gap 38 between the base conductive section 34 and each of the stage conductive sections 104, 106, 108. As detailed below, the electrostatic force generated between the base conductive section 34 and the stage conductive sections 104, 106, 108, is proportional to the square of the voltage and inversely proportional to the square of the gap 38. Thus, it is important to accurately measure the size of the gap 38.

As provided herein, the gap measuring device 132 includes a first capacitance sensor 134, a second capacitance sensor 136 and a third capacitance sensor 138 that accurately determine the gap 38 between the base conductive section 34 and each of the stage conductive sections 104, 106, 108. In this embodiment, (i) the first capacitance sensor 134 measures the capacitance that is formed between the base conductive section 34 and the first stage conductive section 104, (ii) the second capacitance sensor 136 measures the capacitance that is formed between the base conductive section 34 and the second stage conductive section 106, and (iii) the third capacitance sensor 138 measures the capacitance that is formed between the base conductive section 34 and the third stage conductive section 108. With this information, the gap measuring device 132 is able to determine the gap 38 between the base conductive section 34 and each of the stage conductive sections 104, 106, 108 by measuring the capacitance. Subsequently, the information regarding the gap 38 can be directed to the control system 22.

As provided herein, each of the capacitance sensors 134, 136, 138 can measure capacitance utilizing conventional means using a high frequency signal superimposed on the low frequency servo voltage. For example, the capacitance can be measured by introducing a high frequency AC voltage on each stage conductive section and measuring the AC current at the same frequency.

Alternately, a small section (not shown) of each stage conductive section 104, 106, 108 can be partitioned off within each stage conductive section 104, 106, 108. In this design, each capacitance sensor 134, 136, 138 measures the capacitance between the small section of the respective stage conductive section 104, 106, 108 and the base conductive section 34 and the measurement signal is not combined with the servo voltage.

The control system 22 controls the stage mover assembly 16 to precisely position the stage body 50 and the stage 14 along the X axis, along the Y axis, and about the Z axis. In the embodiment illustrated herein, the control system 22 directs and controls the current to the conductor array for each of the XZ housing movers 64, 66 to control movement of the stage 14 along the X axis and about the Z axis. Similarly, the control system 22 directs and controls the current to conductor array of the Y mover 68 to control movement of the stage 14 along the Y axis.

Additionally, the control system 22 directs and controls voltage to the base conductive section 34 and the stage conductive assembly 36 to control the position of the stage 14 relative to the guide base 12. More specifically, the control system 22 independently controls voltage to (i) the base conductive section 34 to electrically charge the base conductive section 34, (ii) the first stage conductive section 104 to electrically charge the first stage conductive section 104, (iii) the second stage conductive section 106 to electrically charge the second stage conductive section 106, and (iv) the third stage conductive section 108 to electrically charge the third stage conductive section 108. The control system 22 controls voltage to the conductive sections 34, 104, 106, 108 to control the position of the stage body 50 relative to the guide base 12 along the Z axis, about the X axis and about the Y axis and the stiffness of the bearing.

In the embodiment illustrated in FIGS. 1 and 2, the stage 14 is supported along the Z axis by electrostatic forces that are generated between the base conductive section 34 and the independent stage conductive sections 104, 106, 108. More specifically, the control system 22 individually, actively controls the voltage to the base conductive section 34 and each of the stage conductive sections 104, 106, 108 to adjust the position of the stage 14 relative to the guide base 12 along the Z axis, about the X axis and about the Y axis. Further, the control system 22 individually controls the voltage to each of the stage conductive sections 104, 106, 108 to adjust the gap 38, e.g. the flying height and the stiffness relative to any measured position reference. Thus, the control system 22 actively controls the gap 38 and the stiffness of the stage bearing assembly 18. It should be noted that the position of the stage 14 along the Z axis, about the X axis and about the Y axis can also be adjusted by adjusting the position of the guide base 12 with the base movers 45 if the control system 22 is trying to maintain a constant gap 38.

The electrostatic attraction force (F) per unit area that is generated by (i) the base conductive section 34 and the first stage conductive section 104, (ii) the base conductive section 34 and the second stage conductive section 106, and (iii) the base conductive section 34 and the third stage conductive section 108 is proportional to the voltage difference $(V_s-V_g)$ squared and inversely proportional to the gap 38 distance (h) squared. This relationship can be represented by the formula $F=(\epsilon_0/2) [A(V_s-V_g)^2/(h_1+h_2/K)^2]$. In this formula (i) $\epsilon_0$=constant=$8.85\times10^{-12}$ Farad/m, (ii) A is the area, (iii) $V_s$ is the voltage of the respective stage conductive section 104, 106, 108, (iv) $V_g$ is the voltage of the base conductive section 34, (v) $h_2$ is the thickness of the dielectric film 114, and (vi) K is the dielectric constant of the dielectric film 114. When the base conductive section 34 and the stage conductive sections 104, 106, 108 have opposing voltage potentials, the electrostatic force is attractive and the stage body 50 is drawn toward the guide base 12.

Because the forte (F) is inversely proportional to the gap squared, the stage bearing assembly 18 is statically unstable at a constant voltage. Therefore, the control system 22 is required to stabilize the stage bearing assembly 18.

In the embodiment illustrated in FIGS. 1 and 2, a counteracting force is provided by gravity (i.e. the weight of the stage 14). In this design, the control system 22 controls the voltage to the stage conductive sections 104, 106, 108 to balance the upward electrostatic force and the downward force of the weight of the stage 14 to support the stage 14 spaced apart the desired gap 38. Additionally, the stage bearing assembly 18 could be designed to include a low-stiffness air bearing, an air bearing with a soft spring, or other means to suspend the stage 14.

To achieve an electrostatic attraction force, the control system 22 controls the voltage to the base conductive section 34 and each of the stage conductive sections 104, 106, 108 so that the base conductive section 34 is at a different voltage than the stage conductive sections 104, 106, 108. Preferably, the control system 22 maintains the base conductive section 34 at ground potential so as not to attract electrons or other charged or ionized particles. Alternately, for example, the base conductive section 34 can be a negative voltage and the stage conductive sections 104, 106, 108 can be at a positive voltage.

Further, the control system 22 independently controls the voltage to the stage conductive sections 104, 106, 108 to actively control the electrostatic force generated by the stage bearing assembly 18 and to actively adjust the size of the gap 38. As provided herein, the size of the gap 38, i.e. the flying height of the stage 14 can be controlled by the control system 22 to maintain a constant flying height. Alternately, the size of the gap 38 can be adjusted along the Z axis, about the X axis and about the Y axis over a small range by individually adjusting the voltage to the stage conductive sections 104, 106, 108. Typically, the flying gap 38 is controlled to be approximately 20 $\mu$m.

The control system 22 can utilize a position feedback loop gain to control the bandwidth of the stage bearing assembly 18 and the position of the stage 14. More specifically, the gap measuring device 132 accurately measures the size of the gap 38 and the relative positions of the stage 14 and the guide base 12 along the Z axis, about the X axis, and about the Y axis. As provided above, the force generated by the electrostatic bearing is inversely proportional to the gap 38 and is non-linear. The control system 22 uses the position feedback from the gap measuring device 132 to linearize the force per unit voltage calculation and then to control the stiffness of the stage bearing assembly 18. A relatively high position feedback loop gain will provide a relatively stiff stage bearing assembly 18. Stated another way, a relatively high position feedback loop gain will provide a relatively high bandwidth position control of the stage 14 with the stage bearing assembly 18. Additionally, the control system 22 can be designed to change the electrostatic force with changes in vertical velocity, thereby adding damping.

Figure 6C:
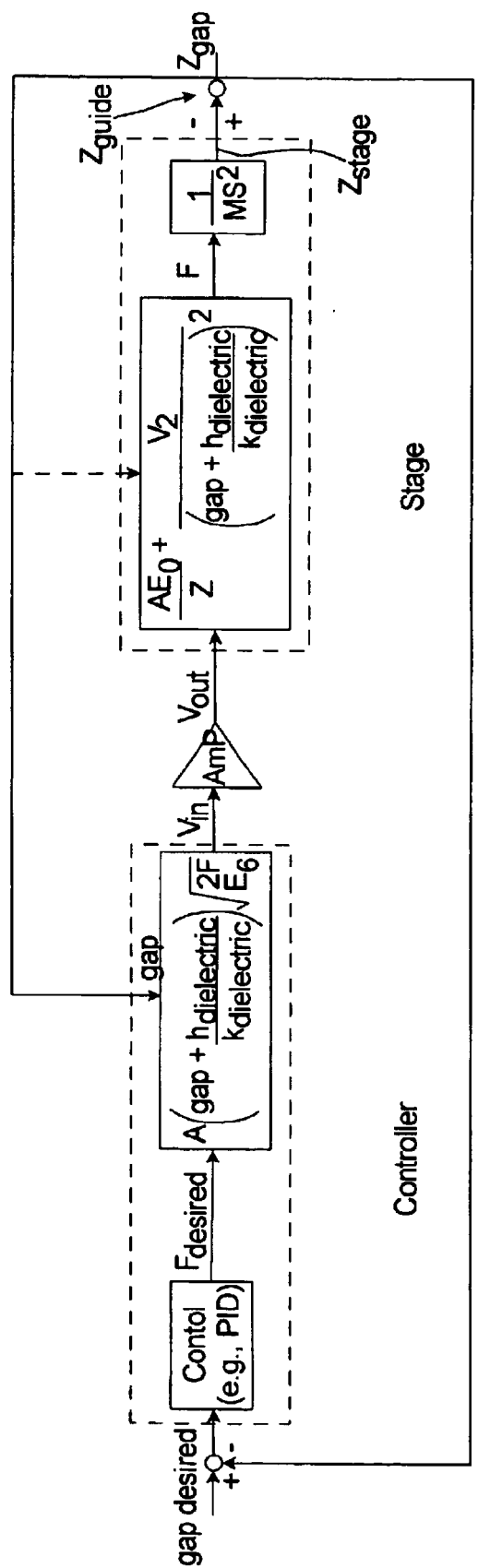
FIG. 6C illustrates a first embodiment of a control block diagram having features of the present invention.
Figure 6D:
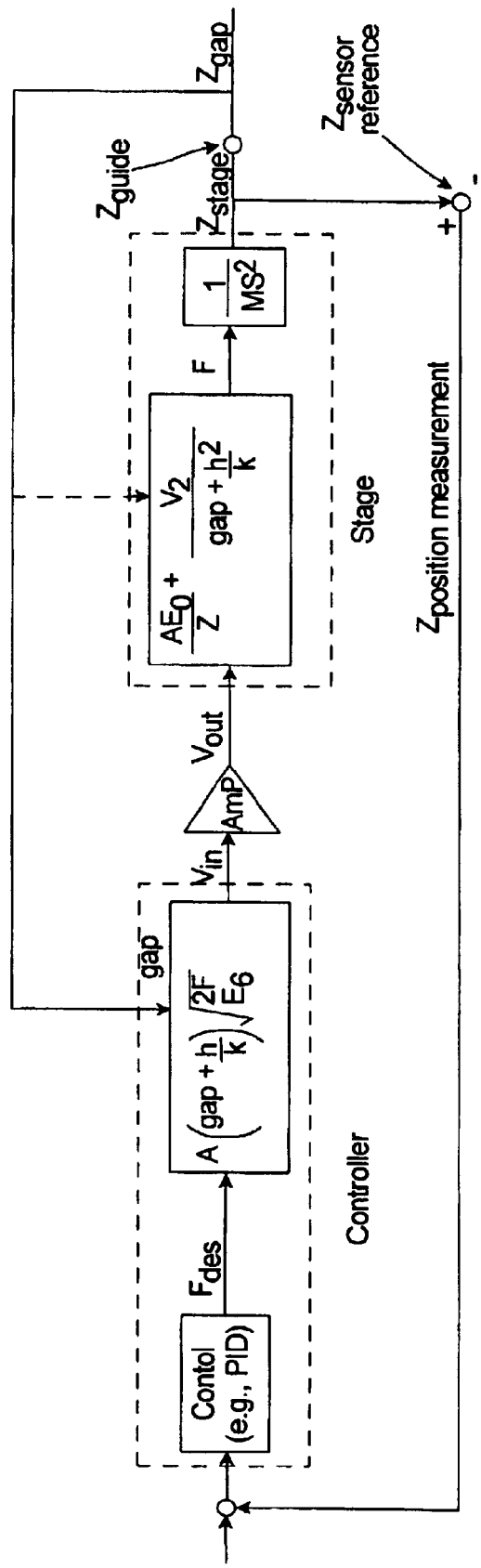
FIG. 6D illustrates a second embodiment of a control block diagram having features of the present invention.

It should be noted that the control system 22 can utilize position feedback from the gap measuring device 132 or the Z sensor 123. In either event, the gap measuring device 132 measures the gap 38 to linearize the nonlinear force characteristics of the stage bearing assembly 18. FIG. 6C illustrates a control block diagram that uses the gap measuring device 132 for position feedback. In this design, the position of the stage 14 is controlled relative to the guide base 12. Alternately, FIG. 6D illustrates a control block diagram that uses the Z sensor 123 for position feedback. In this design, the position of the device 26 is controlled relative to the optical assembly 200 or whatever the Z sensor 123 utilizes as a reference.

Importantly, the electrostatic forces generated by the stage bearing assembly 18 are relatively low and are uniformly distributed over a large area. In contrast, forces generated by air bearings are more localized. Further, a vacuum preload is often required to provide high stiffness to an air bearing. Therefore, the stage 14 illustrated in FIGS. 1 and 2 can have low mass and low stiffness and can be supported without excessive static deformation of the stage 14.

Figure 7A:
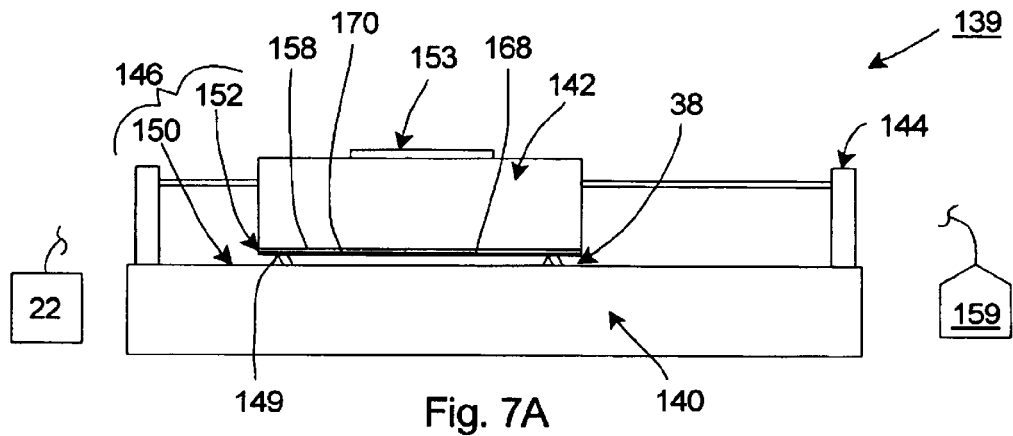
FIG. 7A is a side plan view of a second stage assembly having features of the present invention.

FIG. 7A illustrates a second stage assembly 139 having features of the present invention. In this embodiment, the second stage assembly 139 includes a second guide base 140, a second stage 142, a second stage mover assembly 144 and a second stage bearing assembly 146. In this embodiment, the second guide base 140 is generally rectangular shaped and is secured to the mounting base 24 with a second base frame 148 (illustrated in FIG. 8). The second stage 142 retains an object such as the semiconductor wafer 32. The second stage mover assembly 144 moves the second stage 142 relative to the second guide base 140.

The second stage bearing assembly 146 supports the second stage 142 spaced apart from the second guide base 140 along the Z axis and allows for motion of the second stage 142 relative to the second guide base 140 along the X axis, along the Y axis and about the Z. Further, the second stage bearing assembly 146 adjusts the position of the second stage 142 relative to the second guide base 140 along the Z axis, about the X axis and about the Y axis.

Figure 7B:
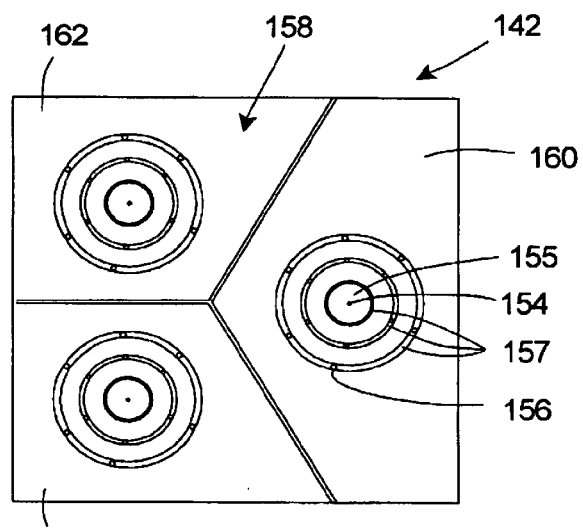
FIG. 7B is a bottom plan view of a second stage having features of the present invention.

Referring to FIGS. 7A and 7B, the second stage bearing assembly 146 includes (i) a fluid bearing 149 to generate an upward force to push the second stage 142 upward away from the second guide base 140 and (ii) a second base conductive section 150 and a second stage conductive assembly 152 that generate a downward, electrostatic attraction force to pull the second stage 142 towards the second guide base 140. The downward, attractive, electrostatic force acts on the second stage 142 when a voltage difference of opposite sign is applied to the second base conductive section 150 and the second stage conductive assembly 152 by the control system 22.

With this combination, the second stage bearing assembly stiffness is determined by the position feedback gain and can be relatively high. The second stage bearing assembly 146 is particularly useful in vacuum applications where a vacuum preload type bearing is ineffective.

Figure 7C:
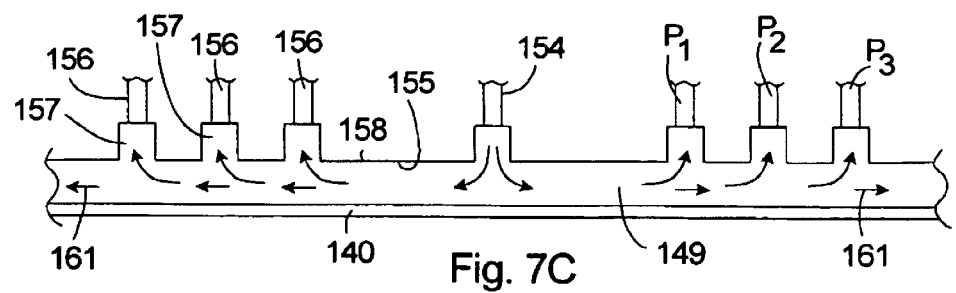
FIG. 7C is a cross-sectional view of a portion of a fluid bearing.

The fluid bearing 149 is preferably designed to minimize fluid that is released to the environment. As illustrated in FIGS. 7B and 7C, a bottom 158 of the second stage 142 includes a plurality of spaced apart fluid outlets 154 and flat surfaces 155 which form the fluid bearings. Each fluid bearing surface 155 is surrounded by a plurality of concentric, annular grooves 157 which are in fluid communication with fluid inlets 156. Each successive groove 157 is separated from the next by lands which are substantially in the same plane as the bearing surface. Pressurized fluid or gas is released from a fluid source 159 (illustrated in FIG. 7A) through the fluid outlets 154 towards the second guide base 140. Each fluid inlet 156 is connected to successive lower pressures in order to recover most of the fluid flow from the fluid outlets 154 and minimize the fluid reaching the vacuum chamber. FIG. 7C illustrates that three concentric grooves 157 surround each bearing surface 155. FIG. 7C also illustrates that some leakage 161 of the fluid occurs. A more detailed description of a suitable fluid bearing is described in International Application No. PCT/US00/04223, entitled "STATIC PRESSURE AIR BEARING", filed Feb. 18, 2000, inventors Watson et al. As far as permitted, the contents of International Application No. PCT/US00/04223 are incorporated herein by reference.

In the embodiment illustrated in FIG. 7A, the second guide base 140 defines the second base conductive section 150. In this design, the second guide base 140 is made of a conductive material or semi-conductive material. Alternately, the second guide base 140 can include a layer of conductive or semi-conductive material deposited at the top of the second guide base 140 that defines the second base conductive section. This layer is conductive or semi-conductive to permit the voltage across the layer to be controlled to any desired level.

The second stage conductive assembly 152 moves with and is secured to the bottom 158 of the second stage 142. As provided herein, the second stage conductive assembly 152 interacts with the second base conductive section 150 to generate an electrostatic attraction force. The design of the second stage conductive assembly 152 can be varied. For example, as illustrated in FIG. 7B, the second stage conductive assembly 152 can include a first stage conductive section 160, a second stage conductive section 162, a third stage conductive section 164, and an isolator 166. Alternately, the second stage conductive assembly 152 can include more than three or less that three stage conductive sections.

In this embodiment, each of the stage conductive sections 160, 162, 164 generates electrostatic force relative to the second base conductive section 150 when a differential voltage is applied between the second base conductive section 150 and each of the stage conductive sections 160, 162, 164 by the control system 22.

In this embodiment, the second stage 142 is preferably made of a non-conductive material to isolate the stage conductive sections 160, 162, 164. As provided herein, each of the stage conductive sections 160, 162, 164 includes a metal conducting layer 168 disposed on the bottom 158 of the wafer stage 142. Further, a dielectric film 170 can be deposited on the conducting layer 168.

The isolator 166 inhibits the flow of voltage between the stage conductive sections 160, 162, 164. The isolator 166 can be a thin strip that is made of any non-conductive material. For example, the isolator 166 can be made of a ceramic material. The isolator 166 is somewhat Y shaped. It should be noted that the isolator is not necessary if the second stage 142 is made of a non-conductive material and the stage conductive sections 160, 162, 164 do not contact each other.

Somewhat similar to the embodiment described above, the control system 22 actively controls the voltage to the second base conductive section 150 and each of the stage conductive sections 160, 162, 164 to control the electrostatic force, the gap 38, and the stiffness.

FIG. 8 is a schematic view illustrating an exposure apparatus 30 useful with the present invention. The exposure apparatus 30 includes the apparatus frame 202, an illumination system 204 (irradiation apparatus), a reticle stage assembly 206, the optical assembly 200 (lens assembly), a wafer stage assembly 210, a reticle chamber 216, and a wafer chamber 218. The stage assembly 10 illustrated in FIGS. 1 and 2 is used as the reticle stage assembly 206 in FIG. 8. Alternately, with the disclosure provided herein, the stage assembly 10 illustrated in FIGS. 1 and 2 can be modified for use as the wafer stage assembly 210. The second stage assembly 139 illustrated in FIG. 7A is used as the wafer stage assembly 210 in FIG. 8. The exposure apparatus 30 mounts to the mounting base 24, e.g., the ground, a base, or floor or some other supporting structure.

The exposure apparatus 30 is particularly useful as a lithographic device that transfers a pattern (not shown) of an integrated circuit from the reticle 26 onto the semiconductor wafer 32. The stage assemblies 206, 210 are particularly useful in a controlled environment. Additionally, it should be noted that the stage assemblies 206, 210 can correspond to the stage assemblies 10, 139, as mentioned above, respectively. Thus, the present invention is particularly useful in an exposure apparatus 30 that utilizes an electron beam.

The reticle chamber 216 encloses and encircles the reticle stage assembly 206 and provides the controlled environment around the reticle 26. The design of the reticle chamber 216 can be varied to suit the design requirements of the exposure apparatus 30. The reticle chamber 216 illustrated in FIG. 8 is generally rectangular shaped and defines a generally rectangular shaped chamber cavity.

Similarly, the wafer chamber 218 encloses and encircles the wafer 32 and provides the controlled environment around the wafer 32. The wafer chamber 218 illustrated in FIG. 8 is generally rectangular shaped.

The desired environment in each chamber 216, 218 varies accordingly to the type of exposure apparatus. For example, for an exposure apparatus 30, the desired controlled environment can be an inert gas such as Argon, Helium, or Nitrogen. Alternately, for example, the controlled environment can be a vacuum, some other fluid or some other environment.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 8 supports the optical assembly 200 and the illumination system 204 and the reticle stage assembly 206 above the mounting base 24. Further, in the embodiment illustrated in FIG. 8, the apparatus frame 202 is secured with the apparatus isolators 44 to the mounting base 24.

The illumination system 200 includes an illumination source 212 and an illumination optical assembly 214. The illumination source 212 emits a beam (irradiation) of light or electron beam energy. The illumination optical assembly 214 guides the beam from the illumination source 212 to the optical assembly 200. The beam illuminates selectively different portions of the reticle 26 and exposes the semiconductor wafer 32.

The optical assembly 200 projects and/or focuses the light or electron beam passing through the reticle 26 to the wafer 32. Depending upon the design of the exposure apparatus 30, the optical assembly 200 can magnify or reduce the image illuminated on the reticle 26.

The reticle stage assembly 206 holds and positions the reticle 26 relative to the optical assembly 200 and the wafer 32. Similarly, the wafer stage assembly 210 holds and positions the wafer 32 with respect to the projected image of the illuminated portions of the reticle 26 in the operational area. Depending upon the design, the exposure apparatus 30 can also include additional motors to move the stage assemblies 206, 210.

There are a number of different types of lithographic devices. For example, the exposure apparatus 30 can be used as scanning type photolithography system that exposes the pattern from the reticle onto the wafer with the reticle and the wafer moving synchronously. In a scanning type lithographic device, the reticle is moved perpendicular to an optical axis of the optical assembly 200 by the reticle stage assembly 206 and the wafer is moved perpendicular to an optical axis of the optical assembly 200 by the wafer stage assembly 210. Scanning of the reticle and the wafer occurs while the reticle and the wafer are moving synchronously.

Alternately, the exposure apparatus 30 can be a step-and-repeat type photolithography system that exposes the reticle while the reticle and the wafer are stationary. In the step and repeat process, the wafer is in a constant position relative to the reticle and the optical assembly 200 during the exposure of an individual field. Subsequently, between consecutive exposure steps, the wafer is consecutively moved by the wafer stage perpendicular to the optical axis of the optical assembly 200 so that the next field of the wafer is brought into position relative to the optical assembly 200 and the reticle for exposure. Following this process, the images on the reticle are sequentially exposed onto the fields of the wafer so that the next field of the wafer is brought into position relative to the optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 200 included in the photolithography system, the optical assembly 200 need not be limited to a reduction system. It could also be a 1× or magnification system.

With respect to a optical assembly 200, when far ultra-violet rays such as the excimer laser is used, glass materials such as quartz and fluorite that transmit far ultra-violet rays is preferable to be used. When the $F_2$ type laser or x-ray is used, the optical assembly 200 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-136475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
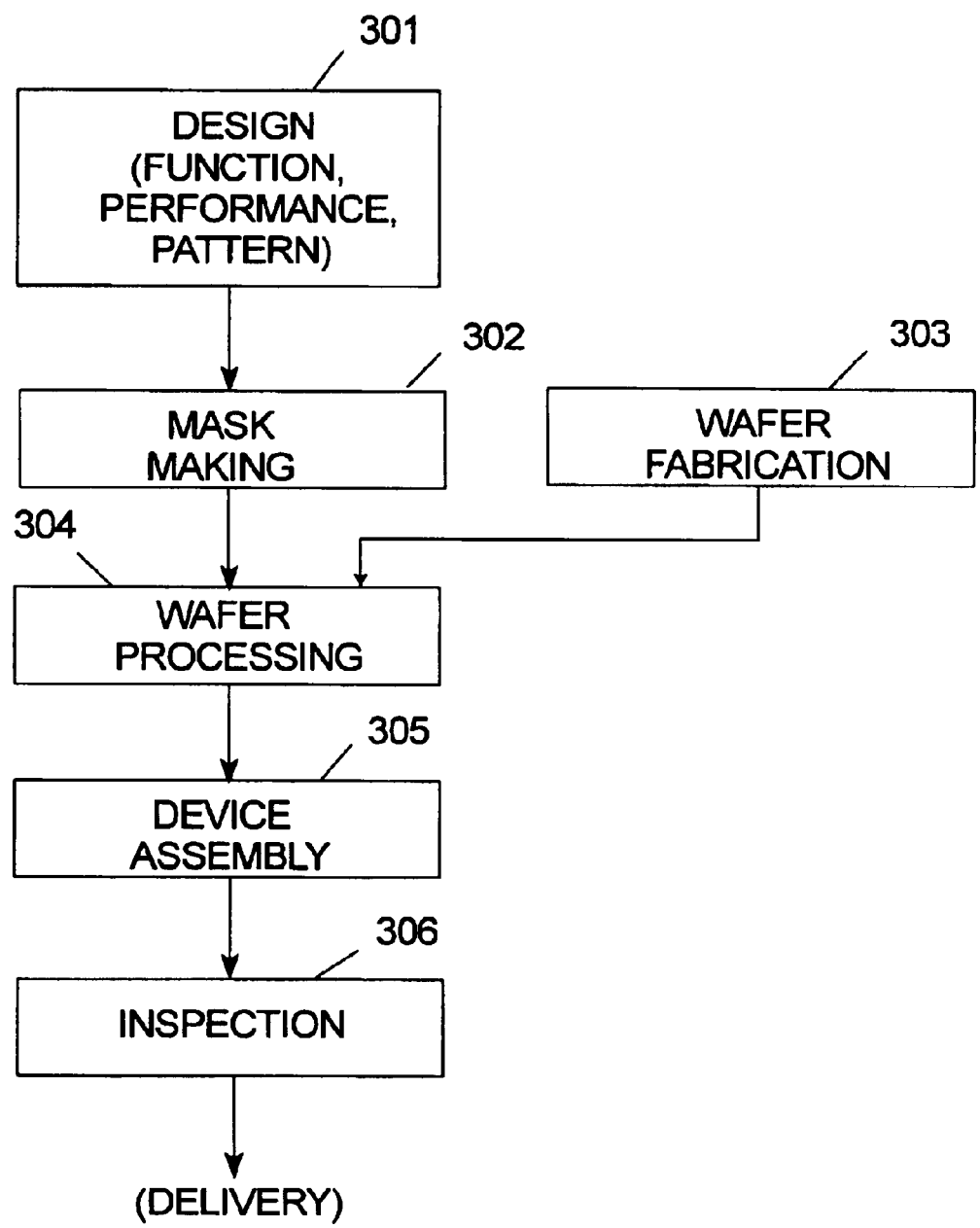
FIG. 9 is a flow chart that outlines a process for manufacturing a semiconductor wafer in accordance with the present invention.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 10:
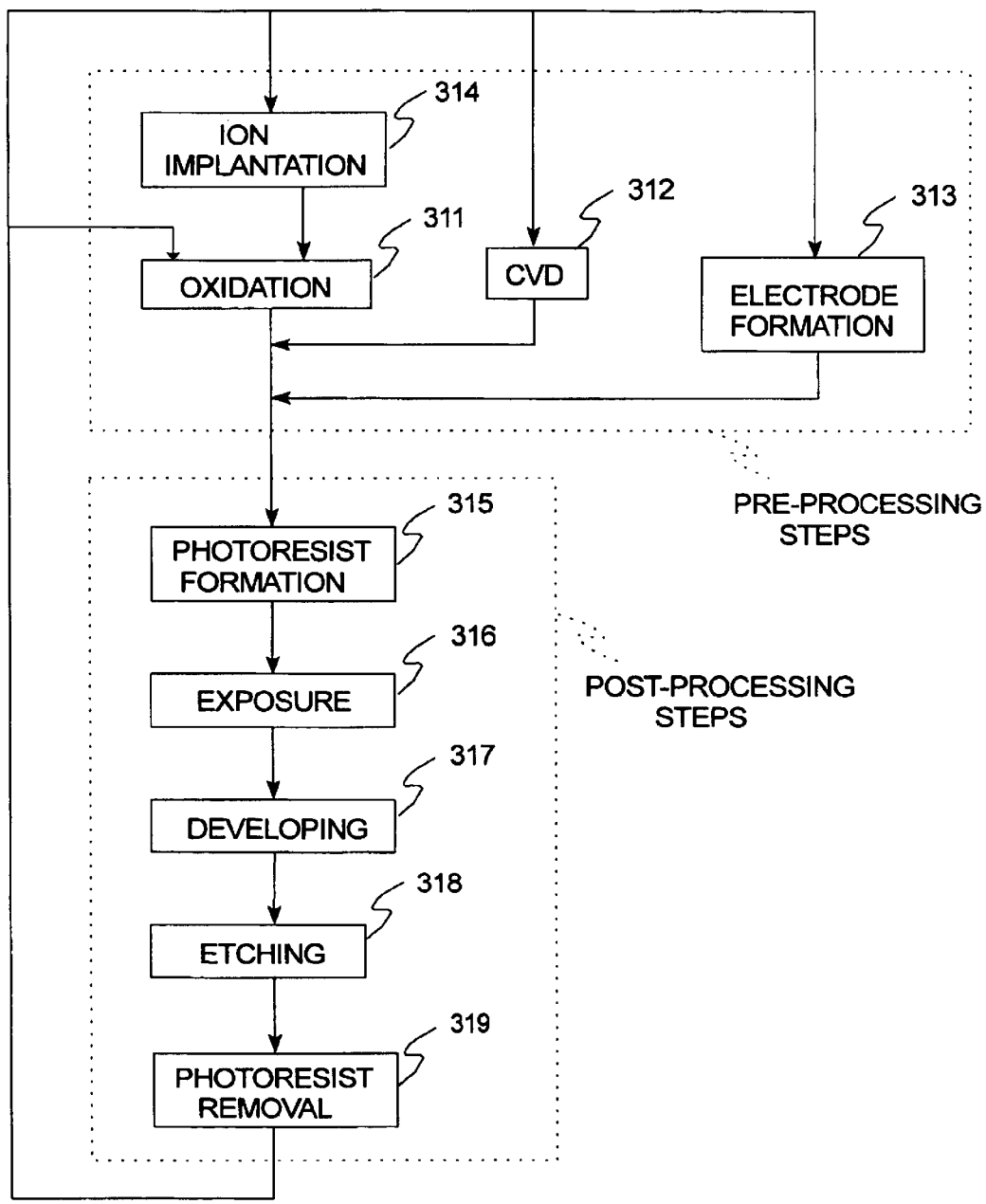
FIG. 10 is a flow chart that outlines semiconductor wafer processing in more detail.

FIG. 10 illustrates a detailed flowchart example of the abovementioned step 304 in the case of fabricating semiconductor devices. In FIG. 10, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device an X stroke along an X axis and along a Y axis, the stage assembly comprising:
    a guide base;
    a stage that retains the device; and
    a Y mover that moves the stage along the Y axis relative to the guide base, the Y mover including a reaction component and a moving component that is secured to the stage; wherein one of the components includes a magnet having a magnet length that extends along the X axis and the other component includes a conductor having a conductor length along the X axis, and wherein the magnet length is sufficiently long so that the magnet interacts with the conductor over the range of the X stroke and there is relative movement between the conductor and the magnet along the X axis over the range of the X stroke.

2. The stage assembly of claim 1 wherein the magnet length is at least as long as the combination of the X stroke along the X axis plus the conductor length.

3. The stage assembly of claim 1 wherein the reaction component includes the magnet and the moving component includes the conductor.

4. The stage assembly of claim 1 wherein the reaction component includes a plurality of spaced apart magnets.

5. The stage assembly of claim 1 wherein the reaction component includes the conductor and the moving component includes the magnet.

6. The stage assembly of claim 1 further comprising an X housing mover that moves the stage the X stroke along the X axis relative to the guide base.

7. The stage assembly of claim 1 wherein the magnet length is sufficiently long so that substantially the entire conductor remains within the magnetic fields of the magnet throughout the entire X stroke.

8. An exposure apparatus including the stage assembly of claim 1.

9. An object manufactured with the exposure apparatus according to claim 8.

10. A wafer on which an image has been formed by the exposure apparatus of claim 8.

11. A stage assembly that moves a device an X stroke along an X axis and along a Y axis, the stage assembly comprising:
a guide base;
a stage that retains the device; and
a Y mover that moves the stage along the Y axis relative to the guide base, the Y mover including a reaction component and a moving component that is secured to the stage; wherein one of the components includes a magnet having a magnet length that extends along the X axis and the other component includes a conductor having a conductor length along the X axis, and wherein the conductor length is sufficiently long so that the conductor interacts with the magnet over the range of the X stroke and there is relative movement between the conductor and the magnet along the X axis over the range of the X stroke.

12. The stage assembly of claim 11 wherein the conductor length is at least as long as the combination of the X stroke along the X axis plus the magnet length.

13. The stage assembly of claim 11 wherein the reaction component includes the magnet and the moving component includes the conductor.

14. The stage assembly of claim 11 wherein the reaction component includes a plurality of spaced apart magnets.

15. The stage assembly of claim 11 wherein the reaction component includes the conductor and the moving component includes the magnet.

16. The stage assembly of claim 11 further comprising an X housing mover that moves the stage the X stroke along the X axis relative to the guide base.

17. An exposure apparatus including the stage assembly of claim 11.

18. An object manufactured with the exposure apparatus according to claim 17.

19. A wafer on which an image has been formed by the exposure apparatus of claim 17.

20. A method for making a stage assembly that moves a device an X stroke along an X axis and along a Y axis, the method comprising the steps of:
providing a stage that retains the device;
providing a guide base; and
moving the stage along the Y axis relative to the guide base with a Y mover, the Y mover including a reaction component and a moving component that is secured to the stage; wherein one of the components includes a magnet having a magnet length that extends along the X axis and the other component includes a conductor having a conductor length along the X axis, and wherein the magnet length is sufficiently long so that the magnet interacts with the conductor over the range of the X stroke and there is relative movement between the conductor and the magnet along the X axis over the range of the X stroke.

21. The method of claim 20 wherein the magnet length is at least as long as the combination of the X stroke along the X axis plus the conductor length.

22. The method of claim 20 wherein the step of moving the stage includes the step of providing a reaction component that includes the magnet and the step of providing a moving component that includes the conductor.

23. The method of claim 20 further comprising the step of moving the stage an X stroke along the X axis relative to the guide base with an X mover.

24. A method for making an exposure apparatus that forms an image on a wafer, the method comprising the steps of:
providing an irradiation apparatus that irradiates the wafer with radiation to form the image on the wafer; and
providing the stage assembly made by the method of claim 20.

25. A method of making a wafer utilizing the exposure apparatus made by the method of claim 24.

26. A method of making an object including at least the exposure process; wherein the exposure process utilizes the exposure apparatus made by the method of claim 24.

27. A method for making a stage assembly that moves a device an X stroke along an X axis and along a Y axis, the method comprising the steps of:
providing a stage that retains the device;
providing a guide base; and
moving the stage along the Y axis relative to the guide base with a Y mover, the Y mover including a reaction component and a moving component that is secured to the stage; wherein one of the components includes a magnet having a magnet length that extends along the X axis and the other component includes a conductor having a conductor length along the X axis, and wherein the conductor length is at least as long as the combination of the X stroke along the X axis plus the magnet length and there is relative movement between the conductor and the magnet along the X axis over the range of the X stroke.

28. The method of claim 27 wherein the step of moving the stage includes the step of providing a reaction component that includes the magnet and the step of providing a moving component that includes the conductor.

29. A method for making an exposure apparatus that forms an image on a wafer, the method comprising the steps of:
providing an irradiation apparatus that irradiates the wafer with radiation to form the image on the wafer; and
providing the stage assembly made by the method of claim 27.

30. A method of making a wafer utilizing the exposure apparatus made by the method of claim 29.

31. A method of making an object including at least the exposure process; wherein the exposure process utilizes the exposure apparatus made by the method of claim 29.

32. The method of claim 27 further comprising the step of moving the stage an X stroke along the X axis relative to the guide base with an X mover.

33. A stage assembly that moves a device along a first axis and along a second axis, the stage assembly comprising:
a guide base;
a stage that retains the device;
a first mover that moves the stage a first stroke along the first axis relative to the guide base; and
a second mover that moves the stage along the second axis relative to the guide base, the second over including a reaction component and a moving component that is secure to the stage, wherein one of the components includes a magnet having a magnet length that extends along the first axis and the other component includes a conductor having a conductor length along the first axis, wherein the conductor length is sufficiently long so that the conductor interacts with the magnet over the range of the first stroke and there is relative movement between the conductor and the magnet along the first axis over the range of the first stroke, and wherein the conductor length is at least as long as the combination of the first stroke along the first axis plus the magnet length.

34. The stage assembly of claim 33 wherein the reaction component includes a plurality of spaced apart magnets and the moving component includes a plurality of spaced apart conductors.

35. The stage assembly of claim 33 wherein the reaction component includes a plurality of spaced apart conductors and the moving component includes a plurality of spaced apart magnets.

36. An exposure apparatus including the stage assembly of claim 33.

37. An object manufactured with the exposure apparatus according to claim 36.

38. A wafer on which an image has been formed by the exposure apparatus of claim 36.

39. A stage assembly that moves a device along a first axis and along a second axis, the stage assembly comprising:

a guide base;

a stage that retains the device;

a first mover that moves the stage a first stroke along the first axis relative to the guide base; and a second mover that moves the stage along the second axis relative to the guide base, the second mover including a reaction component and a moving component that is secured to the stage, wherein one of the components includes a magnet having a magnet length that extends along the first axis and the other component includes a conductor having a conductor length along the first axis, wherein the magnet length is sufficiently long so that the magnet interacts with the conductor over the range of the first stroke and there is relative movement between the conductor and the magnet along the first axis over the range of the first stroke, and wherein the magnet length is at least as long as the combination of the first stroke along the first axis plus the conductor length.

40. The stage assembly of claim 39 wherein the reaction component includes a plurality of spaced apart magnets and the moving component includes a plurality of spaced apart conductors.

41. The stage assembly of claim 39 wherein the reaction component includes a plurality of spaced apart conductors and the moving component includes a plurality of spaced apart magnets.

42. An exposure apparatus including the stage assembly of claim 39.

43. An object manufactured with the exposure apparatus according to claim 42.

44. A wafer on which an image has been formed by the exposure apparatus of claim 42.

45. A stage assembly that moves a device along an X axis and a Y axis, the stage assembly comprising:

a guide base;

a stage that retains the device; and a stage mover assembly connected to the stage, the stage mover assembly moving the stag along the X axis and along the Y axis relative to the guide base, the stage mover assembly includes a Y housing mover that moves the stage along the Y axis, the Y housing mover including a magnet that is substantially fixed relative o the guide base and a conductor that is secured to the stage, the conductor moving relative to the magnet array; wherein the magnet has a magnet length that extends along the X axis and the conductor has a conductor length along the X axis and wherein the magnet length is greater than the combination of the stroke of the stage along the X axis and the conductor length.

* * * * *

UNITED STATES PATENT AND TRADEMARK OFFICE
CERTIFICATE OF CORRECTION

PATENT NO.     : 6,794,660 B2
DATED          : September 21, 2004
INVENTOR(S)    : Watson It is certified that error appears in the above-identified patent and that said Letters Patent is hereby corrected as shown below:

Column 24,
Line 62, after the phrase "mover that", please insert the word -- independently --.

Column 25,
Line 36, after the phrase "mover that", please insert the word -- independently --.

Column 26,
Line 61, please delete the word "over" and insert the word -- mover --.

Column 28,
Line 24, please delete the word "stag" and insert the word -- stage --.
Line 28, after the phrase "fixed relative", please delete the "o" and insert the word -- to --.

Signed and Sealed this

First Day of February, 2005

JON W. DUDAS
*Director of the United States Patent and Trademark Office*